US012169208B2

(12) United States Patent
Stallcup, II et al.

(10) Patent No.: US 12,169,208 B2
(45) Date of Patent: Dec. 17, 2024

(54) PROBE TIP X-Y LOCATION IDENTIFICATION USING A CHARGED PARTICLE BEAM

(71) Applicant: Innovatum Instruments Inc., Los Altos, CA (US)

(72) Inventors: Richard E Stallcup, II, Frisco, TX (US); Michael Berkmyre, Princeton, TX (US); Ronen Benzion, Los Altos, CA (US); Carlo Floresca, Frisco, TX (US)

(73) Assignee: Innovatum Instruments Inc., Los Altos, CA (US)

( * ) Notice: Subject to any disclaimer, the term of this patent is extended or adjusted under 35 U.S.C. 154(b) by 198 days.

(21) Appl. No.: 18/070,659

(22) Filed: Nov. 29, 2022

(65) Prior Publication Data

US 2023/0168274 A1    Jun. 1, 2023

Related U.S. Application Data

(60) Provisional application No. 63/284,310, filed on Nov. 30, 2021.

(51) Int. Cl.
*H01J 37/22* (2006.01)
*G01Q 20/00* (2010.01)
(Continued)

(52) U.S. Cl.
CPC ............. *G01Q 20/00* (2013.01); *G01Q 60/40* (2013.01); *H01J 37/28* (2013.01)

(58) Field of Classification Search
CPC ......... G01Q 20/00; G01Q 60/40; H01J 37/00; H01J 37/02; H01J 37/22; H01J 37/222;
(Continued)

(56) References Cited

U.S. PATENT DOCUMENTS 3,345,567 A    10/1967    Turner et al.
5,019,771 A    5/1991    Yang et al.
(Continued)

FOREIGN PATENT DOCUMENTS

CN    211043432    7/2020
CN    113281298    8/2021
(Continued)

OTHER PUBLICATIONS

Alpuche-Aviles et al: "Impedance Feedback Control for Scanning Electrochemical Microscopy," Analy. Chem., Oct. 15, 2001, 73(20):4873-4881.
(Continued)

*Primary Examiner* — Jason L McCormack
(74) *Attorney, Agent, or Firm* — Fish & Richardson P.C.

(57) ABSTRACT

An automated system for controlling a conductive probe of a nanoprober system in situ to a charged particle beam (CPB) imaging system can include a nanoprober comprising an actuator and a conductive probe; signal measurement circuitry electrically coupled to the conductive probe and to receive an electrical signal from the conductive probe; and a hardware processor to execute operations. The operations can include activating a CPB within a first reference frame, the first reference frame associated with the CPB; causing, by a computerized control system, the CPB and the conductive probe to intersect; measuring an electrical response from the intersection of the CPB with the conductive probe; and determining a location of the conductive probe in a second reference frame based on the electric response from the intersection of the CPB with the conductive probe, the second reference frame associated with the conductive probe.

28 Claims, 14 Drawing Sheets

(51) Int. Cl.
*G01Q 60/40* (2010.01)
*H01J 37/28* (2006.01)

(58) Field of Classification Search
CPC .. H01J 37/26; H01J 37/27; H01J 37/20; H01J 2237/208
USPC .............. 250/306, 307, 311, 440.11, 442.11; 850/5
See application file for complete search history.

(56) References Cited

U.S. PATENT DOCUMENTS

| | | |
|---|---|---|
| 5,193,383 A | 3/1993 | Burnham et al. |
| 5,644,245 A | 7/1997 | Saitoh et al. |
| 5,705,814 A | 1/1998 | Young et al. |
| 6,703,258 B2 | 3/2004 | Hopson et al. |
| 6,853,204 B2 | 2/2005 | Nishiyama et al. |
| 6,891,170 B1 | 5/2005 | Yu et al. |
| 6,967,335 B1 | 11/2005 | Dyer et al. |
| 7,057,408 B2 | 6/2006 | Schneidewind et al. |
| 7,319,336 B2 | 1/2008 | Baur et al. |
| 7,373,265 B2 | 5/2008 | Gibson et al. |
| 7,473,887 B2 | 1/2009 | Miles et al. |
| 7,656,075 B2 | 2/2010 | Voigtländer et al. |
| 7,659,742 B1 | 2/2010 | Jacobson et al. |
| 7,786,436 B1 | 8/2010 | Lundquist et al. |
| 7,888,143 B1 | 2/2011 | Keating et al. |
| 8,438,660 B2 | 5/2013 | Hirooka et al. |
| 8,536,526 B2 | 9/2013 | Bell et al. |
| 8,895,923 B2 | 11/2014 | Ukraintsev et al. |
| 8,910,311 B2 | 12/2014 | Humphris et al. |
| 8,971,099 B1 | 3/2015 | Wang et al. |
| 9,057,740 B1 | 6/2015 | Ukraintsev et al. |
| 9,134,367 B2 | 9/2015 | Pagani |
| 9,170,273 B2 | 10/2015 | Kane et al. |
| 9,506,947 B2 | 11/2016 | Ukraintsev et al. |
| 9,551,743 B2 | 1/2017 | Erickson |
| 9,709,600 B2 | 7/2017 | Barends et al. |
| 9,805,910 B1 | 10/2017 | Trease et al. |
| 9,891,280 B2 | 2/2018 | Ukraintsev et al. |
| 10,175,295 B2 | 1/2019 | Ukraintsev et al. |
| 10,373,799 B2 | 8/2019 | Neuman |
| 10,539,589 B2 | 1/2020 | Ukraintsev et al. |
| 10,613,115 B2 | 4/2020 | Amponsah |
| 11,029,336 B2 | 6/2021 | Vettori et al. |
| 2005/0269511 A1 | 12/2005 | Tomimatsu et al. |
| 2009/0189075 A1 | 7/2009 | Nishiyama et al. |
| 2010/0019786 A1 | 1/2010 | Potok et al. |
| 2010/0064784 A1 | 3/2010 | Caudill et al. |
| 2010/0163727 A1* | 7/2010 | Bell ...................... H01J 37/265 250/307 |
| 2011/0151597 A1 | 6/2011 | Chang et al. |
| 2011/0291009 A1* | 12/2011 | Ando ...................... H01J 37/28 250/307 |
| 2012/0086466 A1 | 4/2012 | Chou |
| 2013/0032714 A1* | 2/2013 | Kitayama ............. H01J 37/304 250/306 |
| 2014/0380531 A1 | 12/2014 | Ukraintsev et al. |
| 2015/0377958 A1 | 12/2015 | Ukraintsev et al. |
| 2015/0380210 A1* | 12/2015 | Budach ................. H01J 37/28 250/307 |
| 2016/0370425 A1 | 12/2016 | Stallcup et al. |
| 2017/0003336 A1 | 1/2017 | Ippolito et al. |
| 2017/0115341 A1 | 4/2017 | Frigoli et al. |
| 2020/0278380 A1 | 9/2020 | Osterberg et al. |
| 2021/0125808 A1 | 4/2021 | Floresca et al. |
| 2021/0270891 A1 | 9/2021 | Komori et al. |
| 2021/0375657 A1 | 12/2021 | Krupyshev et al. |
| 2023/0258707 A1 | 8/2023 | Stallcup, II et al. |

FOREIGN PATENT DOCUMENTS

| | | |
|---|---|---|
| DE | 102018009623 B | 3/2021 |
| EP | 1045253 | 10/2000 |
| EP | 3467519 A1 | 4/2019 |
| JP | H05-215812 | 8/1993 |
| JP | H07-240445 | 9/1995 |
| JP | H08-115959 | 5/1996 |
| JP | H09-326425 | 12/1997 |
| JP | 2000-284025 | 10/2000 |
| JP | 2001-110347 | 4/2001 |
| JP | 2001-324459 | 11/2001 |
| JP | 2003-273175 | 9/2003 |
| JP | 2005-327883 | 11/2005 |
| JP | 2005333161 A | 12/2005 |
| JP | 2006227108 A | 8/2006 |
| JP | 2007-258271 | 10/2007 |
| JP | 2008-115959 | 5/2008 |
| JP | 2008-204813 | 9/2008 |
| JP | 2009-122122 | 6/2009 |
| JP | 4625375 B2 | 2/2011 |
| JP | 4625376 | 2/2011 |
| JP | 2011033422 | 2/2011 |
| JP | 2012-083230 | 4/2012 |
| JP | 2019-090626 | 6/2019 |
| JP | 2021-111639 | 8/2021 |
| KR | 20100119432 | 11/2010 |
| TW | 201123330 | 7/2011 |
| WO | WO 2011/129315 | 10/2011 |

OTHER PUBLICATIONS

Extended European Search Report in European Appln. 22210556.1, dated Apr. 28, 2023, 13 pages.
Extended European Search Report in European Appln. No. 23156133.3, dated Jul. 11, 2023, 15 pages.
Lee et al: "An impedance based non-contact feedback control system for scanning probe microscopes," Rev. Sci. Instrum., Apr. 1, 1996, 67(4):1468-1471.
Ru et al: "Automated Four-Point Probe Measurement of Nanowires Inside a Scanning Electron Microscope," IEEE Transactions on Nanotechnology, IEEE, USA, Jul. 1, 2011, 10(4):674-681.

* cited by examiner

PROBE TIP X-Y LOCATION IDENTIFICATION USING A CHARGED PARTICLE BEAM

CROSS REFERENCE TO RELATED APPLICATION

This patent application claims the benefit of U.S. Provisional Patent Application having Ser. No. 63/284,310, titled PROBE TIP X-Y LOCATION COORDINATION, filed on Nov. 30, 2022, the entire contents of which are incorporated by reference herein.

BACKGROUND

A charged particle beam (CPB) imaging system can be used to examine nanometer scale objects. In general, a CPB imaging system employs a charged particle beam, such as an electron beam, that irradiates an object to visualize the object or features of the object that cannot be visualized using optical microscopes. For example, features that are smaller than the wavelength of light can be visualized using a CPB imaging system.

CPB imaging systems can view details at the atomic level with sub-nanometer resolution (e.g., down to about 0.1 nm resolution) at a magnification of up to about one million. CPB imaging systems include scanning electron microscopes (SEM), focused ion beam (FIB) microscopes, and transmission electron microscopes (TEM), among others.

A scanning electron microscope (SEM) is a type of CPB imaging system. In an example SEM, a beam of electrons is scanned over the surface of the object. Detectors collect the backscattered and secondary electrons reflected or otherwise originating from the surface of the object and convert the collected electrons into a signal that is used to produce a real-time, multi-dimensional visualization of the specimen.

SUMMARY

Aspects of the embodiments are directed to a method performed in a charged particle imaging system, the method including activating a charged particle beam within a first reference frame, the first reference frame associated with the charge particle beam; causing, by a computerized control system, the charged particle beam and a conductive probe to intersect; measuring an electrical response from the intersection of the charged particle beam with the conductive probe; determining a location of the conductive probe in a second reference frame based on the electric response from the intersection of the charged particle beam with the conductive probe, the second reference frame associated with the conductive probe; and correlating the location of the conductive probe in the second reference frame with the first reference frame.

In some embodiments, measuring the electrical response includes measuring a net current absorbed by the conductive probe from the intersection of the charged particle beam and the conductive probe.

Some embodiments include performing a first series of probe scans through a charged particle beam region; for each of the first series of probe scans, measuring a first set of electrical responses corresponding to an intersection of the conductive probe with the charged particle beam; creating a current profile of the conductive probe based on the first set of electrical response from each of the first series of scans; and wherein determining the location of the conductive probe includes performing a second series of probe scans through the charged particle beam region, the second series of probe scans including a fewer number of scans than the first series of probe scans; for each of the second series of probe scans, measuring a second set of electrical responses corresponding to an intersection of the conductive probe with the charged particle beam; and determining a location of the conductive probe based on a comparison of the first set of electrical responses with the second set of electrical responses. A probe scan can include move the probe through the CPB or moving the CPB to scan the probe.

In some embodiments, causing the charged particle beam and the conductive probe to intersect includes causing the charged particle beam and the conductive probe to intersect at a first position of the conductive probe; the method including measuring a first electrical response from the intersection of the charged particle beam and the conductive probe at the first position; determining that the charged particle beam and the conductive probe intersect at the first position of the conductive probe based on the measured first electrical response; causing the charged particle beam and the conductive probe to intersect at a second position of the conductive probe; measuring a second electrical response from the intersection of the charged particle beam and the conductive probe at the second position; and determining that the charged particle beam and the conductive probe intersect at the second position of the conductive probe based on the measured second electrical response.

In some embodiments, determining a location of the conductive probe in a second reference frame based on the electric response from the intersection of the charged particle beam with the conductive probe includes determining an X and Y position of the conductive probe within the second reference frame.

Some embodiments include correlating the X and Y position of the conductive probe within the second reference frame with a coordinate system of the first reference frame.

Some embodiments include correlating the X and Y position of the conductive probe within the second reference frame with a coordinate system of the first reference frame using a transformation matrix.

In some embodiments, activating the charged particle beam within a first reference frame includes activating the charged particle beam at a fixed, known location within the first reference frame.

In some embodiments, causing the charged particle beam and the conductive probe to intersect includes moving the conductive probe to intersect charged particle beam at a first position of the conductive probe.

In some embodiments, causing the charged particle beam and the conductive probe to intersect includes moving the charged particle beam to intersect the conductive probe.

In some embodiments, moving the charged particle beam to intersect the conductive probe includes determining a scan angle for the charged particle beam to intersect the conductive probe; and moving the charged particle beam to intersect the conductive probe based on the determined scan angle.

In some embodiments, moving the charged particle beam to intersect the conductive probe includes moving the charged particle beam in a circular direction at a first radius of curvature to intersect the conductive probe at a first position of the conductive probe; determining that the charged particle beam intersects the first position of the conductive probe; moving the charged particle beam in a circular direction at a second radius of curvature to intersect the conductive probe at a second position of the conductive probe; and determining that the charged particle beam intersects the second position of the conductive probe.

In some embodiments, the second radius of curvature is less than the first radius of curvature.

In some embodiments, the conductive probe is a first conductive probe, the method further including determining that the charged particle beam intersects a second conductive probe at a third position of the second conductive probe; and moving the charged particle beam in a circular direction at a third radius of curvature to intersect the second conductive probe at a fourth position of the second conductive probe.

Aspects of the embodiments include a system that includes an imaging system including a charged particle beam emitter to emit a charged particle beam; a nanoprober including an actuator, the nanoprober configured to secure a conductive probe; signal measurement circuitry electrically coupled to the conductive probe, the signal measurement circuit to receive signal from the conductive probe; and at least one tangible, non-transitory computer-readable medium for storing instructions that when executed cause a hardware processor to execute operations, the operations including activating a charged particle beam within a first reference frame, the first reference frame associated with the charge particle beam; causing, by a computerized control system, the charged particle beam and a conductive probe to intersect; measuring an electrical response from the intersection of the charged particle beam with the conductive probe; determining a location of the conductive probe in a second reference frame based on the electric response from the intersection of the charged particle beam and the conductive probe, the second reference frame associated with the conductive probe; and determining a location of the conductive probe in the first reference frame based on the location of the conductive probe in the second reference frame.

In some embodiments, measuring the electrical response includes measuring a net current absorbed by the conductive probe from the intersection of the charged particle beam and the conductive probe.

In some embodiments, the operations include performing a first series of probe scans through a charged particle beam region; for each of the first series of probe scans, measuring a first set of electrical responses corresponding to an intersection of the conductive probe with the charged particle beam; creating a current profile of the conductive probe based on the first set of electrical response from each of the first series of scans; and wherein determining the location of the conductive probe includes performing a second series of probe scans through the charged particle beam region, the second series of probe scans including a fewer number of scans than the first series of probe scans; for each of the second series of probe scans, measuring a second set of electrical responses corresponding to an intersection of the conductive probe with the charged particle beam; and determining a location of the conductive probe based on a comparison of the first set of electrical responses with the second set of electrical responses.

In some embodiments, causing the charged particle beam and a conductive probe to intersect includes causing the charged particle beam and the conductive probe to intersect at a first position of the conductive probe; the operations including measuring a first electrical response from the intersection of the charged particle beam and the conductive probe at the first position; determining that the charged particle beam and the conductive probe intersect at the first position of the conductive probe based on the measured first electrical response; causing the charged particle beam and the conductive probe to intersect at a second position of the conductive probe; measuring a second electrical response from the intersection of the charged particle beam and the conductive probe at the second position; and determining that the charged particle beam and the conductive probe intersect at the second position of the conductive probe based on the measured second electrical response.

In some embodiments, determining a location of the conductive probe in a second reference frame based on the electric response from the intersection of the charged particle beam with the conductive probe includes determining an X and Y position of the conductive probe within the second reference frame.

In some embodiments, the operations include correlating the X and Y position of the conductive probe within the second reference frame with a coordinate system of the first reference frame.

In some embodiments, the operations include correlating the X and Y position of the conductive probe within the second reference frame with a coordinate system of the first reference frame using a transformation matrix.

In some embodiments, activating the charged particle beam within a first reference frame includes activating the charged particle beam at a fixed, known location within the first reference frame.

In some embodiments, the operations also include a motion control system to control motion of the nanoprober actuator based on information received from the signal measurement circuitry, the motion of the nanoprober actuator to move the conductive probe, and wherein causing the charged particle beam and the conductive probe to intersect includes moving, by the motion control system, the conductive probe to intersect charged particle beam at a first position of the conductive probe.

In some embodiments, causing the charged particle beam to intersect the conductive probe includes moving the charged particle beam to intersect the conductive probe.

In some embodiments, moving, by the motion control system, the charged particle beam to intersect the conductive probe includes determining a scan angle for the charged particle beam to intersect the conductive probe; and moving the charged particle beam to intersect the conductive probe based on the determined scan angle.

In some embodiments, moving the charged particle beam to intersect the conductive probe includes moving the charged particle beam in a circular direction at a first radius of curvature to intersect the conductive probe at a first position of the conductive probe; determining that the charged particle beam intersects the first position of the conductive probe; moving the charged particle beam in a circular direction at a second radius of curvature to intersect the conductive probe at a second position of the conductive probe; and determining that the charged particle beam intersects the second position of the conductive probe.

In some embodiments, the second radius of curvature is less than the first radius of curvature.

In some embodiments, the conductive probe is a first conductive probe, the operations further including determining that the charged particle beam intersects a second conductive probe at a third position of the second conductive probe; and moving the charged particle beam in a circular direction at a third radius of curvature to intersect the second conductive probe at a fourth position of the second conductive probe.

Aspects of the embodiments include an apparatus including signal measurement circuitry to receive signal from a conductive probe; a motion control system to control motion of the conductive probe; and at least one tangible, non-transitory computer-readable medium for storing instructions that when executed cause a hardware processor to execute operations, the operations including activating a charged particle beam within a first reference frame, the first reference frame associated with the charge particle beam; causing the charged particle beam and a conductive probe to intersect; measuring, by the signal measurement circuitry, an electrical response from the intersection of the charged particle beam and the conductive probe; determining a location of the conductive probe in a second reference frame based on the electric response from the intersection of the charged particle beam and the conductive probe, the second reference frame associated with the conductive probe; and determining a location of the conductive probe in the first reference frame based on the location of the conductive probe in the second reference frame.

In some embodiments, measuring the electrical response includes measuring a net current absorbed by the conductive probe from the intersection of the charged particle beam and the conductive probe.

Some embodiments can include performing a first series of probe scans through a charged particle beam region; for each of the first series of probe scans, measuring a first set of electrical responses corresponding to an intersection of the conductive probe with the charged particle beam; creating a current profile of the conductive probe based on the first set of electrical response from each of the first series of scans; and wherein determining the location of the conductive probe includes performing a second series of probe scans through the charged particle beam region, the second series of probe scans include a fewer number of scans than the first series of probe scans; for each of the second series of probe scans, measuring a second set of electrical responses corresponding to an intersection of the conductive probe with the charged particle beam; determining a location of the conductive probe based on a comparison of the first set of electrical responses with the second set of electrical responses.

In some embodiments, causing the charged particle beam and a conductive probe to intersect includes causing the charged particle beam to intersect the conductive probe at a first position of the conductive probe; the operations including measuring a first electrical response from the intersection of the charged particle beam and the conductive probe at the first position; determining that the charged particle beam and the conductive probe intersect at the first position of the conductive probe based on the measured first electrical response; causing the charged particle beam and a conductive probe to intersect at a second position of the conductive probe; measuring a second electrical response from the intersection of the charged particle beam and the conductive probe at the second position; and determining that the charged particle beam and the conductive probe intersect at the second position of the conductive probe based on the measured second electrical response.

In some embodiments, determining a location of the conductive probe in a second reference frame based on the electric response from the intersection of the charged particle beam with the conductive probe includes determining an X and Y position of the conductive probe within the second reference frame.

In some embodiments, the operations include correlating the X and Y position of the conductive probe within the second reference frame with a coordinate system of the first reference frame.

In some embodiments, the operations include correlating the X and Y position of the conductive probe within the second reference frame with a coordinate system of the first reference frame using a transformation matrix.

BRIEF DESCRIPTION OF THE DRAWINGS

Like reference numbers indicate like components. Drawings are not to scale.

DETAILED DESCRIPTION

This disclosure describes determining a position of a probe tip of a nanoprober system in situ to a charged particle beam (CPB) imaging system using non-visual techniques, and mapping the probe tip location from a nanoprober reference frame to the reference frame of the CPB imaging system. With the techniques described herein, a probe tip location is physically detected and located independent of imaging or visual inspection, and can be identified independent of background objects that could be near or just below the probe tip. Non-visual, in situ identification of a probe tip within a CPB imaging system, and the subsequent localization of the probe tip within the CPB imaging system reference frame facilitates automation of in situ device testing.

Figure 1A:
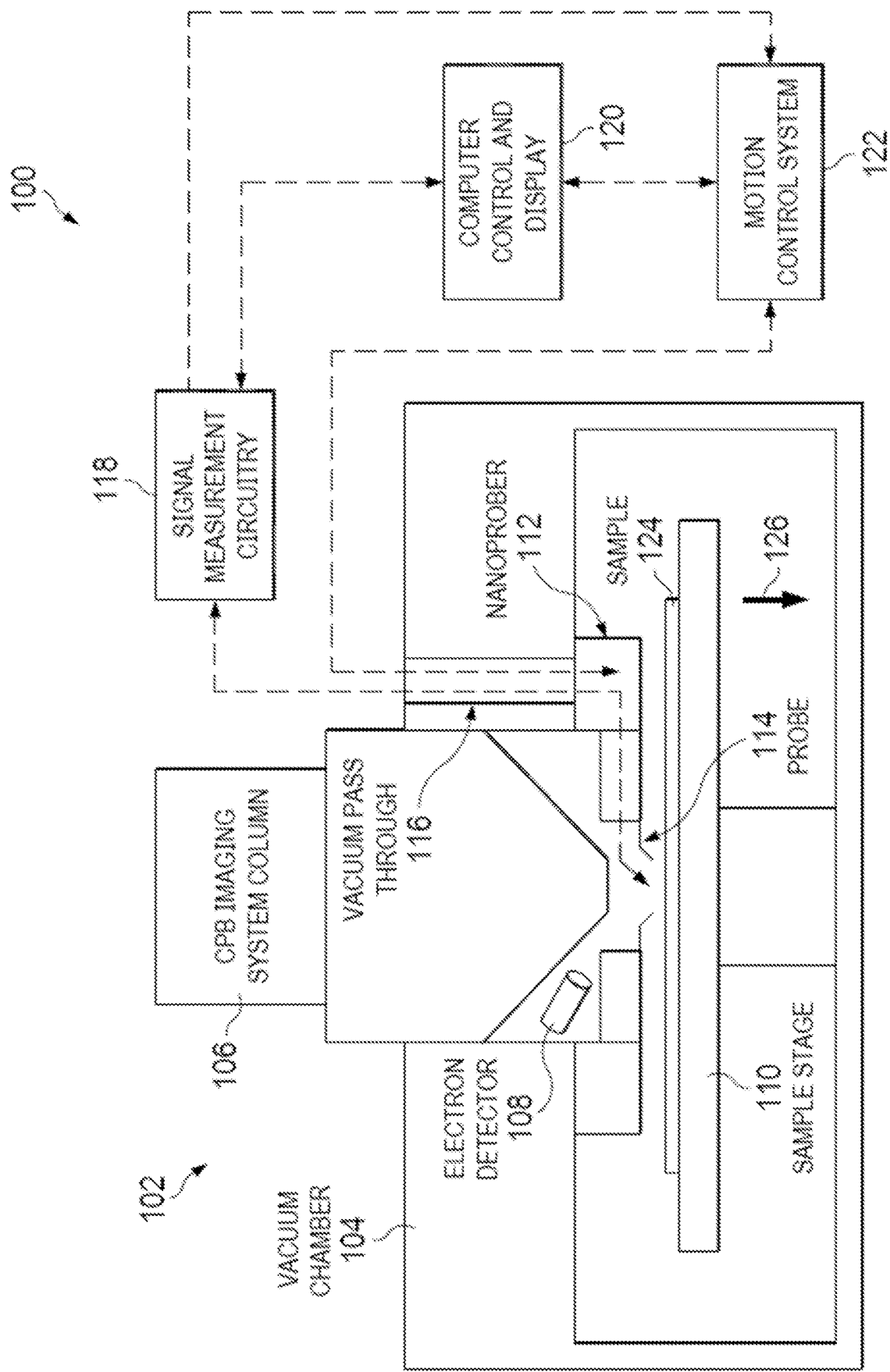
FIGS. 1A-1B are schematic diagrams of example charged particle beam imaging systems that include nanoprobers and measurement and control circuitry in accordance with embodiments of the present disclosure.
Figure 1B:
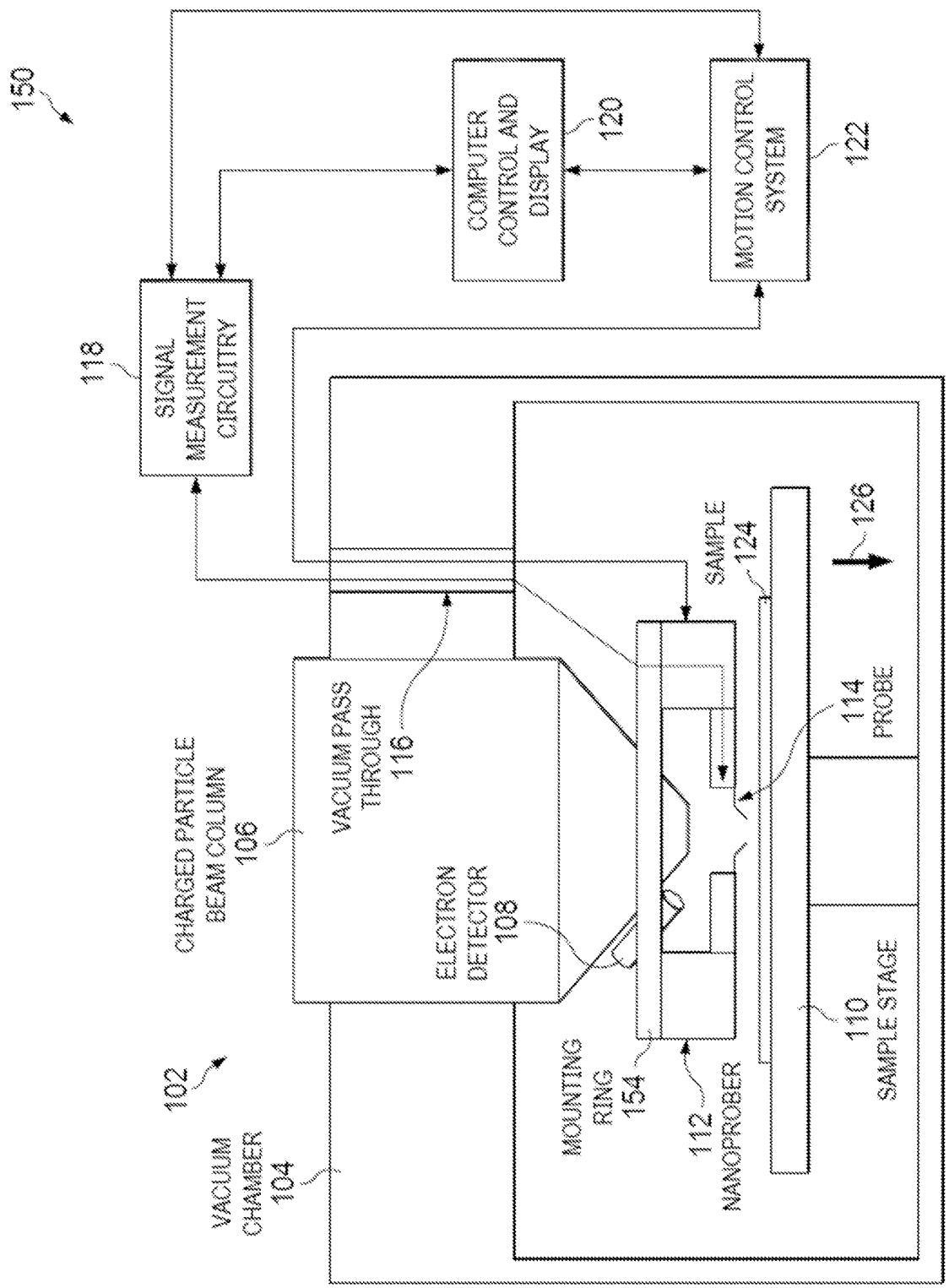

FIGS. 1A-1B are schematic diagrams of charged particle beam imaging systems that include nanoprobers, signal measurement circuitry, and a motion control system in accordance with embodiments of the present disclosure. FIG. 1A shows the nanoprobers coupled to a ceiling surface of the vacuum chamber, while FIG. 1B shows the nanoprobers coupled to a mounting ring that is attached to the CPB column. The systems of FIGS. 1A and 1B include a charged particle beam imaging system that contains nanoprobers and measurement and control circuitry in accordance with embodiments of the present disclosure.

FIG. 1A illustrates a first example embodiment of an automated probe landing system 100 and a charged particle beam system 102 in accordance with embodiments of the present disclosure. CPB system 102 can be a scanning electron microscope, focused ion beam system, combination of SEM and FIB, or other type of CPB system for imaging micrometer and nanometer scale structures. The CPB system 102 includes a vacuum chamber 104. CPB system 102 can include seals, pumps, and other equipment to create a vacuum within the vacuum chamber. The CPB system 102 includes a CPB imaging column 106. CPB imaging column 106 can emit charged particle beams, such as electron beams, positron beams, or focused ion beams towards a target. The CPB system 102 includes an electron detector 108 for detecting electrons as part of the imaging process. Within the vacuum chamber 104 is a sample stage 110 for holding a sample 124. Sample stage 110 can be controllable and trainable to move automatically to position a device under test (DUT) under the CPB imaging column 106. Put differently, sample stage 110 is an encoded sample stage 110. Sample stage 110 is also electrically connected to the external electronic systems, so that the sample stage 110 can act as an electrical return or electrical ground, or can be biased. Sample stage 110 can include a return line 126 that can serve as an electrical neutral line or a ground line. The return line 126 can complete a circuit between the conductive probe and the DUT so that voltage applied to the DUT with the probe can cause current to flow back to the signal measurement circuitry through the return line 126.

The return line 126 can also be used as a signal channel. In some embodiments, the return line 126 can be connected to an input channel of the signal measurement circuitry 118. The signal measurement circuitry 118 can measure current through the sample or sample stage 110. For example, net current absorbed through the sample or sample stage 110 can be detected by the signal measurement circuitry 118. This net current absorption measurement can be used, for example, to determine probe tip location by measuring net current absorbed through the sample stage instead of (or in addition to) measuring net current absorbed through the probe tip. The CPB can interact with the sample or sample stage 110 to cause a current to flow through return line 126 and into signal measurement circuitry 118. The probe tip and the CBP can intersect, as described below. When the probe tip and the CPB intersect, the probe tip essentially can block the CPB from interacting with the sample or sample stage 110. The current profile from the sample stage can be used to map the probe tip location by looking at the current profile that is created before and after the probe tip blocks the CPB.

A DUT can be a circuit element, such as a resistor or transistor; or a DUT can be a landing pad or contact pad or other electrode for a circuit element, such as a transistor source or transistor drain contact. Other landing areas for making electrical contact to devices or materials on the chip can be referred to as DUT.

The automated probe landing system 100 includes one or more nanoprobers 112. A nanoprober 112 can include any device capable of nanometer or better (i.e., sub-nanometer) resolution motion. The nanoprober 112 can carry one or more probes 114. A probe 114 can be a metal wire (e.g., tungsten wire) that includes a tapered end, such as those used for scanning tunneling microscopy or any other conductive material.

Nanoprober 112 or a plurality of nanoprobers (as shown) may be used inside the CPB imaging system 102 to acquire additional information about a sample. Each nanoprober 112 can be controlled by a motion control system 122. The nanoprober 112 is electrically connected to a motion control system 122 through a vacuum pass-through 116, such as through a sidewall of the vacuum chamber or through a door of the vacuum chamber. In the embodiment shown in FIG. 1A, the nanoprober 112 can be secured to the ceiling of the vacuum chamber 104. Typically, vacuum chambers 104 for CPB systems are large, heavy pieces of equipment, which makes them mechanically stable. Securing the nanoprober 112 to the ceiling of the vacuum chamber 104 can provide mechanical stability to the nanoprobers.

Turning briefly to FIG. 1B, FIG. 1B is a schematic diagram of another embodiment of an automated probe landing system 150 and a charged particle beam system 102 in accordance with embodiments of the present disclosure. The automated probe landing system 150 is similar to automated probe landing system 100 described herein but includes a mounting ring 154. Mounting ring 154 can be secured to the CPB column or surround the CPB column and be secured to the ceiling of the vacuum chamber 104. The nanoprober(s) 112 can be secured to the mounting ring 154. The benefit of a mounting ring 154 is that no mounting holes need to be drilled into the vacuum chamber 104, which can create vacuum pressure issues. Instead, the mounting ring 154 can be fixedly secured using brackets or other mechanisms to the CPB column 106. An additional advantage to the mounting ring 154 is that the mounting ring 154 can be structured so that the center of the mounting ring 154 is coaxial with the CPB column 106. The mounting ring 154 can secure nanoprobers 112 to known and fixed locations around an origin that is coaxial to the CPB column and coaxial with the charged particle beam itself.

Returning to FIG. 1A, the motion control system 122 can be directly coupled to the nanoprober 112 or can be connected to the nanoprober through intermediate electronics, such as through a computer system 120. The motion control system 122 can be any type of control system that can provide electrical signals to the nanoprober to cause the nanoprober 112 to move or to cause the probe 114 to move. Motion control system 122 can cause the nanoprober 112 to move or cause the probe 114 to move in an automated matter (i.e., without operator input). The motion control system 122 and/or computer 120 can include software or firmware that are embodied on non-transitory media. The software or firmware can include instructions that when executed cause the motion control system 122 to operate the nanoprober 112 to move the probe in one or more directions. For example, the motion control system 122 can be responsive to electrical information received from probe 114 indicating that the probe has landed on the surface of a DUT and can stop moving the probe towards the DUT. Motion control system 122 can also be responsive to the completion of a test to move the probe up and away from the DUT.

The automated probe landing system 100 also includes signal measurement circuitry 118. Signal measurement circuitry 118 can include circuitry to apply electrical signals to the probe 114 and to receive electrical signals from a sample through the probe 114. Signal measurement circuitry 118 can also receive signals through return line 126. The signal measurement circuitry 118 can communicate with the probe 114 through vacuum pass-through 116. Signal measurement circuitry 118 can provide signals to computer 120 and/or motion control system 122. For example, raw data from the probe 114 can be routed through signal measurement circuitry 118 to a computer 120 that can calculate impedance magnitude values and/or phase angle between voltage and current (for ease of the description, phase angle between voltage and current will be referred to simply as "phase angle"). Impedance and/or phase angle can also be calculated by signal measurement circuitry 118 without deviating from the scope of the disclosure. Signal measurement circuitry 118 can also provide signals to the motion control system 122, which can use signals from signal measurement circuitry 118 to automatically control the nanoprober 112.

Each of signal measurement circuitry 118 and motion control system 122 can be individual hardware units or can be packaged into a single unit, such as part of computer 120. Any combination of packaging the signal measurement circuitry 118, motion control system 122, and computer 120 is contemplated by this disclosure. In addition, though not shown, one or both of signal measurement circuit 118 or the motion control system 122 can be implemented using circuitry that reside on or with or proximate to nanoprober 112. The nanoprober 112 can also be powered using a battery or other modular power source. Such implementation choices reduce the number of external cables that are used for signal measurement, nanoprober control, and power delivery.

Computer 120 can include one or more hardware processors, memory, storage, and peripheral components, including user interface components such as a mouse, keyboard, monitor, joystick, or other type of user interface. The computer 120 can include software to allow an operator to control the CPB system 102. The monitor can be used to view images created by the CPB system 102, including real-time imaging of the nanoprober 112 operation. The computer 120 can include hardware and software to perform signal measurements, signal calculations, perform tests, automate the nanoprober, store information, and perform other tasks associated with automated probe movement and landing and device testing. The computer 120 can include signal measurement circuitry and motion control hardware and software, as described herein.

Figure 2:
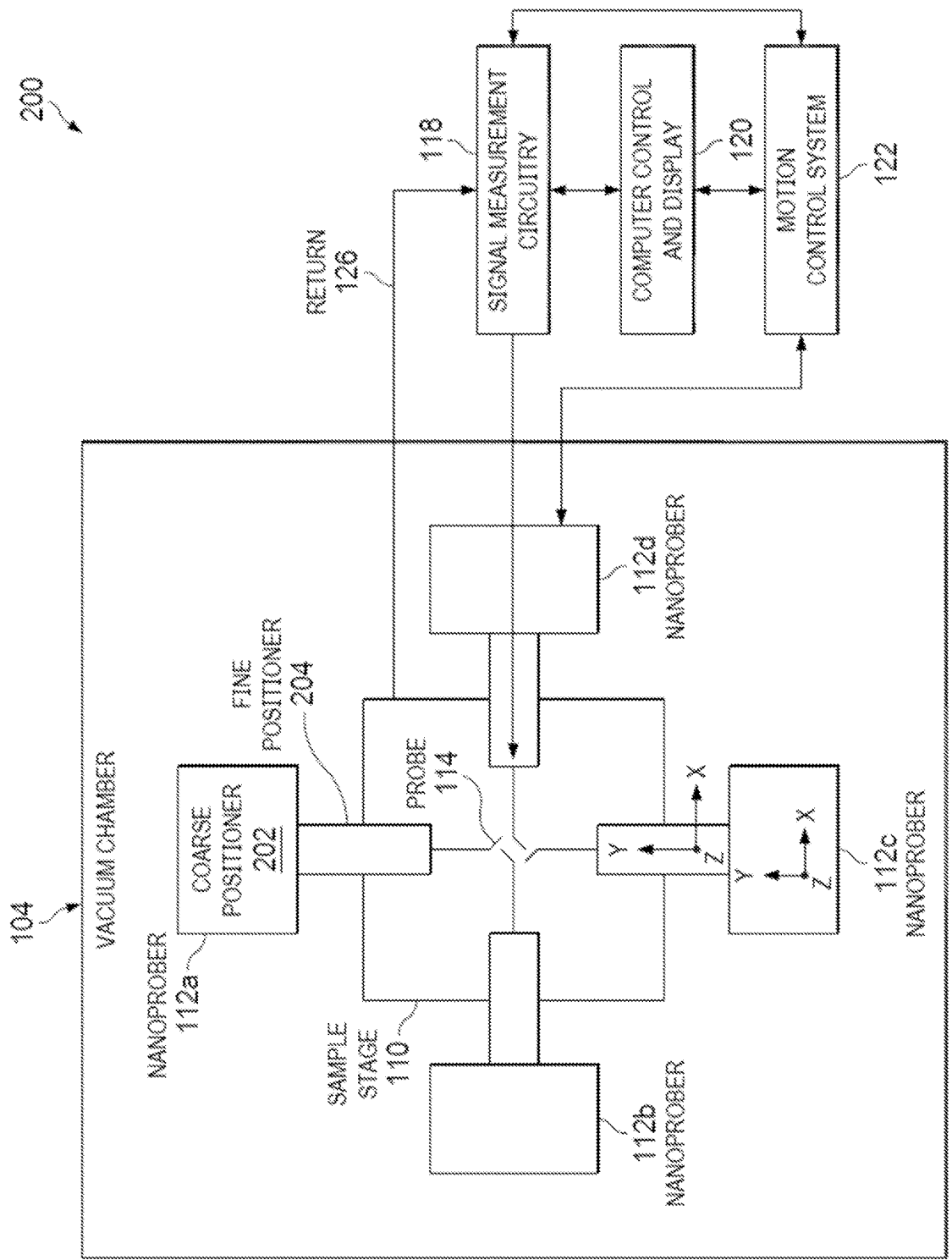
FIG. 2 is a schematic diagram of a top-down view of four nanoprobers above a sample stage within a vacuum chamber of a charged particle beam imaging system in accordance with embodiments of the present disclosure.

FIG. 2 is a schematic diagram of a top-down view of four nanoprobers above a sample stage within a vacuum chamber of a charged particle beam imaging system in accordance with embodiments of the present disclosure. FIG. 2 shows a top-down view of the automated probe landing system of FIG. 1A or 1B. The automated probe landing system includes four nanoprobers 112a-d. Each nanoprober 112a-d includes a coarse positioner 202 and a fine positioner 204. Each of coarse positioner 202 and fine positioner 204 can be controlled by motion control system 122. Motion control system 122 can control the coarse positioner 202 and fine positioner 204 to move in the X-, Y-, or Z-directions. (One of skill in the art would know that other coordinate systems can be used, such as polar coordinates, to described physical space and movement within physical space.)

As shown in FIG. 2, the nanoprober includes coarse movement in the X-, Y-, and Z-directions. The coarse movement can be performed using actuators. The nanoprober also includes fine movement in the X-, Y-, and Z-directions. The fine movement can be performed using piezoelectric materials. Other mechanisms for coarse and fine movement can be used, if each is vacuum compatible and achieves the desired movement resolution.

Nanoprobing systems that reside within a CPB imaging system have relied on a human for controlling the position of each probe. In embodiments, the motion control system 122 can be manually operated. When manually operated, an operator provides control instructions or signals to the nanoprober via a control interface, such as a joystick, mouse, keyboard, smart-device, or other interface controlled by an operator. The motion control system 122 can convert the operator's signals into electrical signals that actuate the fine or coarse movement of the nanoprober. An operator visually watching a live (e.g., SEM) image on a display can move the probe using software control or a hardware controller. This type of control is "open-loop," with the targeting being completed by the operator. In essence, the operator sees the contact point target in the CPB imaging system image and sees the probe tip in the same image. The operator then provides input to the control software using a joystick, mouse motion, or any other controller to move the probe to come into contact with the target point.

Manual probing for in situ testing of semiconductor devices is a time- and labor-intensive process. This disclosure describes systems and devices for determining the location of the probe tip to facilitate automation of in situ nanoprober control so that in situ testing of single digit nanometer features sizes can be achieved without manual operation of a probing device. In order to automate the nanoprober to perform testing without an operator, reference frames for one or more independent system operating within the testing environment are to be correlated (e.g., using transformation matrix, look-up tables, formulas, etc.). The computing system that controls the automation of the testing environment can rely on the correlation of independent reference frames to determine relative locations of the DUT and a tip of the conductive probe. The tip of the conductive probe represents the interface between the DUT and the testing circuitry and software. Accurate testing of the DUT cannot be performed in an automated system unless the computing system that controls the testing environment knows the location of the probe tip relative to the DUT. The computing system can first determine the location of the probe tip in the reference frame of the probe tip, and then transform that location into information representing the location of the probe tip in the reference frame of the DUT.

The computing system can measure net current absorption from the intersection of the CPB with the conductive probe to create a current profile for the conductive probe. The current profile can indicate where along the probe the CPB is intersecting. The probe or the CPB can be repositioned to find the tip. The current absorption profile can be used to determine that the CPB has intersected the probe tip. Net current absorption can be positive or negative, depending on the configuration of the system, the reaction of the electrons as they encounter the probe or the sample, etc.

Nano-probing systems that operate within a CPB imaging system have relied on a human for controlling the position of each probe. An operator visually watching a live (e.g., SEM) image on a display moves the probe using software control or a hardware controller. This type of control is "open loop," with the targeting being completed by the operator. In essence the operator sees the contact point target in the CPB imaging system image and sees the probe tip in the same image. The operator then provides input to the control software using a joystick, mouse motion, or any other controller to move the probe to come into contact with the target point.

This open-loop, human-operated control does not rely on a correlation between the coordinate systems of the CPB imaging system and the nanoprober(s). The human operator can visually guide the probe of the nanoprober in the CPB coordinate system using a manual control system and visual feedback. Correlating the coordinate system of the nanoprober(s) and the CPB imaging system coordinate system, however, facilitates automation and analysis throughput. Put differently, automation can increase throughput of CPB imaging system in situ electrical and/or mechanical analysis applications. Automation is facilitated by correlating the nanoprober coordinate system and the charged particle beam imaging system coordinate system together so that a set of commands can be issued via software to control the nanoprober without a human operator. The automation software can move the probe tip to contact the DUT by knowing where the probe tip is in relation to the DUT.

An additional problem that an automated system has difficulty with is deciphering the probe tip location from the scanning particle beam image that has the sample features in the background. With the sample directly below the probe tip, the image can be cluttered with small features. For an automated system, these features are, in many cases, indistinguishable from the probe tip above. While a human operator can determine the true exact location of the probe tip through visual inspection, the same is not true for automated systems. This disclosure describes mapping an electrical profile of the probe tips so that probe tips can be distinguishable from surface features.

This disclosure describes identifying a probe tip location within the CPB imaging system using non-visual techniques and describes a transformation from the charged particle beam coordinate system to the probe positioner coordinate system in situ to a charged particle beam imaging system. Once this transformation is done, the encoded probe tip location for a corresponding nanoprober is known in the charged particle beam coordinate system. The probe tip now can be positioned directly over any feature with reference to the charged particle beam coordinate system within the range limits of the probe positioner. This capability facilitates an automated probing system that places probe tips in contact on specific predetermined features of a sample, chip, or wafer without assistance of a human control interface. One advantage of this disclosure is that it does not require or use image processing to identify the location of the probe tip. Image processing can be computationally expensive, and probe tip location accuracy can be affected by image background clutter that adds difficulty to probe tip identification. In addition, probe tip location can be quickly recalibrated periodically to account for drift without the high cost associated with image processing techniques.

For the sake of this disclosure, the X-Y coordinate plane of the charged particle beam imaging system is defined as being a plane orthogonal to the charged particle beam itself. The Z direction of the charged particle beam imaging system is defined as being along a direction parallel to the charged particle beam. It is assumed that Z-axis mapping of the probe tips is done prior to X-Y mapping of the probe tips. Z-axis mapping the probe tips ensures that the probe tips will encounter the charged particle beam at the intended working plane. In addition, Z-axis mapping of the probe tips is performed before the target sample and probes can safely occupy the same working plane otherwise catastrophic probe and/or sample damage could occur as a result of uncontrolled probe tip to sample contact. Z-axis mapping is described below.

The working plane is a predetermined plane in which signal collection is performed at a resolution where each feature can be visually observed by an operator (though observation is not a requirement for automation). The working plane is where the CPB imaging system is focused due to the physical design of the CPB optics. The sample, probes, and CPB focus can be observed in the working plane. Practically, the CPB imaging system can function within a depth of field, D, that defines a distance between the nearest and the furthest objects that give an image judged to be in focus.

Alignment of Coordinate Systems in a Wafer Inspection/Review System

The following describes aligning the linear coordinate systems of a patterned wafer, a wafer stage (X-Y axes), and an image formed by beam scanning. Non-linear error sources such as stage motion or position reading imperfections are normally mapped out, a process that is not described here. This alignment process is described to illustrate an example technique to construct a transformation matrix for correlating probe tip location with the CPB imaging reference frame. Generally, the sample that carries the DUT is associated with a CAD map that specifies the location of each device carried by the sample. The sample can include features of interest that can be used to align the sample within the CPB imaging system.

Alignment Process:
1) Pre-alignment: Coarse alignment using wafer notch (Mechanical Pre-Alignment);
2) Global Alignment: Alignment between wafer and stage coordinates (Global Image based Alignment using software and CAD of pattern);
3) CPB system workpoint image alignment: Alignment between stage and beam scanning coordinates;
4) Probe tip alignment.

Pre-Alignment

Before a wafer is loaded onto the stage, it is spun in search of the physical notch at its edge. A wafer notch, wafer flat, or other identifiable feature on the wafer or sample can be used for coarse alignment of the sample. The identifiable feature can aid with both linear alignment within the CPB imaging system and with rotational orientation of the sample within the CPB imaging system. Typically, a wafer notch or flat can be used as a guidepost to indicate a true direction that aids in interpreting the CAD map. The pre-alignment or coarse alignment can be performed by a robotic arm in situ or by an operator placing the sample onto a stage within the CPB imaging system. Rotation angle and translation vector (X-Y shift of the origin) are calculated such that once loaded onto the stage, residual errors are within the search range of the next step in the alignment process.

Global Alignment (Wafer to Stage)

This phase aligns the coordinate system of the printed pattern on the wafer with that of the stage. A pre-learned target is searched for in a sequence of steps that goes from center to edge (errors are maximized at the edge). In each step, an image is acquired using a high power Optical Microscope, the SEM itself, or both. The image is evaluated by software and compared against the CAD map of the printed pattern (or a saved image sample). The shift between the anticipated location of the pattern in the image and the actual location in which it's detected are used to calculate the transformation factors. Specifically, the system uses at least three locations across the wafer (in most cases more locations are used to improve accuracy and average measurement errors) to calculate rotation angle, translation vector (X, Y), magnification vector (X, Y) and axes perpendicularity. This is the complete linear transformation matrix between stage and wafer (CAD) coordinates. Once this is complete, this transformation matrix allows the stage to move to any point on the wafer using the coordinate system of the sample pattern (CAD).

CPB Imaging System Workpoint Alignment

Imaging properties, including coordinate system parameters are done as part of system calibration and are not part of wafer-specific alignment process. Rotation, centering (translation), magnification and perpendicularity are calibrated for each CPB system workpoint (landing energy and beam steering parameters) using a standard calibration wafer. These parameters are stored in the systems calibration files and are revisited only after major system interruption (maintenance or failure).

Target Acquisition Using SEM Image

This phase uses the pre-determined Global Alignment already complete. The stage blind steps to a CAD coordinate. An image is taken using the SEM. The image is evaluated by software and compared against the CAD map of the printed pattern. The shift between the anticipated location of the pattern in the image and the actual location in which it is detected is used to calculate the residual translation vector (in image pixels). Given that the pixel size is known (commanded into the SEM), the exact location of the features in the image size are directly related back to the CAD through the transformation matrix. At this point, we have highly accurate location of image features related to CAD.

Probe Tip Alignment

This disclosure describes identifying a probe tip of a nanoprober system in situ to a CPB imaging system using non-visual techniques and correlating a probe tip coordinate system (or multiple probe tip coordinate systems) to the charged particle beam imaging system coordinate system. The correlation of the probe tip location and the CPB imaging system reference frames complete the creation of the transformation matrix for the sample. A transformation matrix can be created for different samples, and each transformation matrix can be "completed" by the probe tip localization and correlation process. After the probe tip or plurality of probe tips coordinate systems are related to the charged particle beam coordinate system, they are then therefore related to both the stage coordinate system and the sample (e.g., CAD) coordinate system. Once these coordinate system transformation matrices are completed, the probe or plurality of probes can be moved to the sample (e.g., CAD) coordinates. Several embodiments are described to accomplish the probe tip localization.

At this point, the complete sequence facilitates automated probe control and DUT testing on a given CAD structure. Alternatively, CAD files can be substituted with pre-learned images.

Other types of samples besides semiconductor samples with CAD maps can be related to the probe coordinate system in similar ways.

Figure 3:
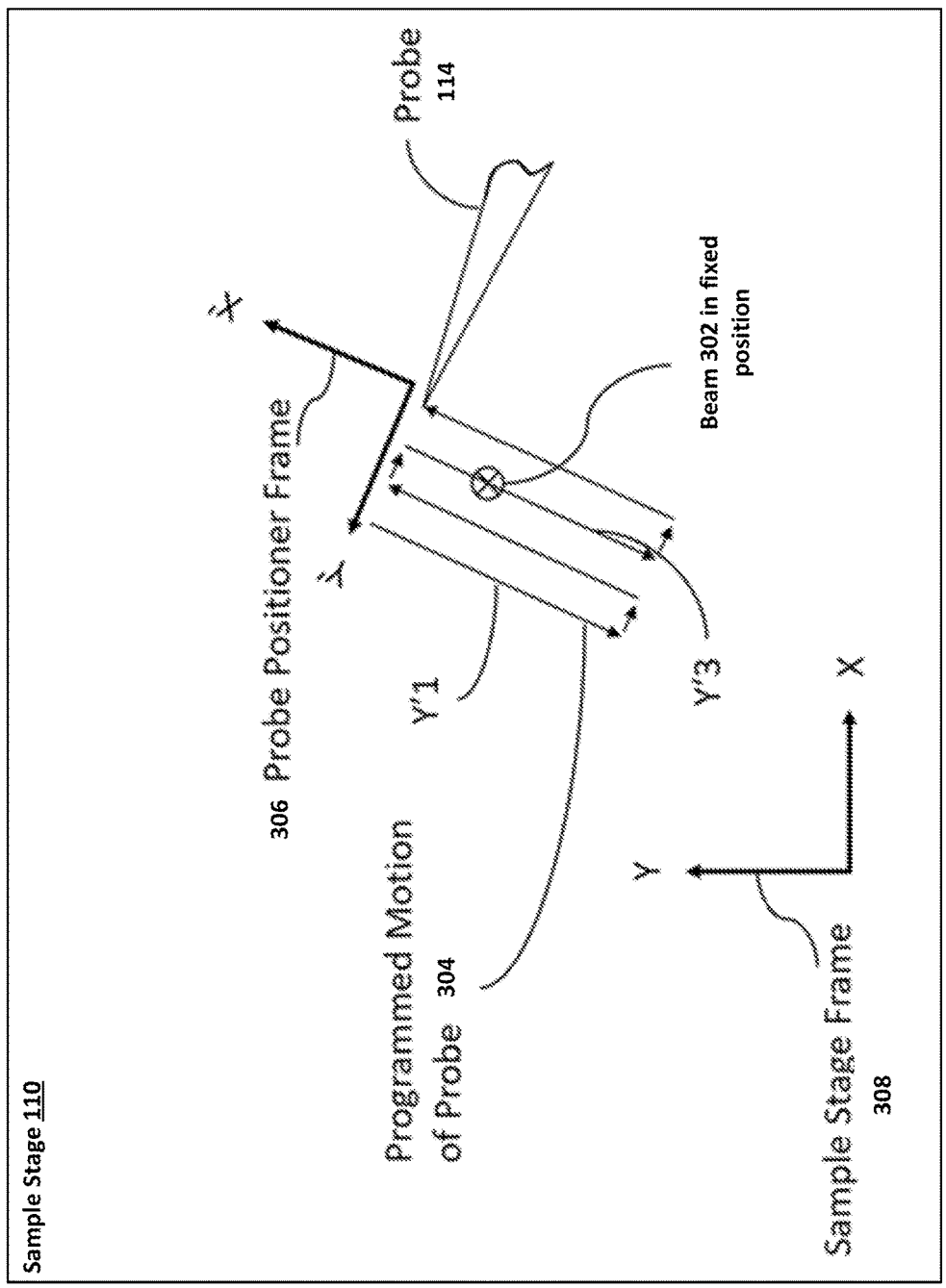
FIG. 3 is a schematic diagram of an example probe tip coordinate system overlaid onto a sample stage coordinate system in accordance with embodiments of the present disclosure.
Figure 4:
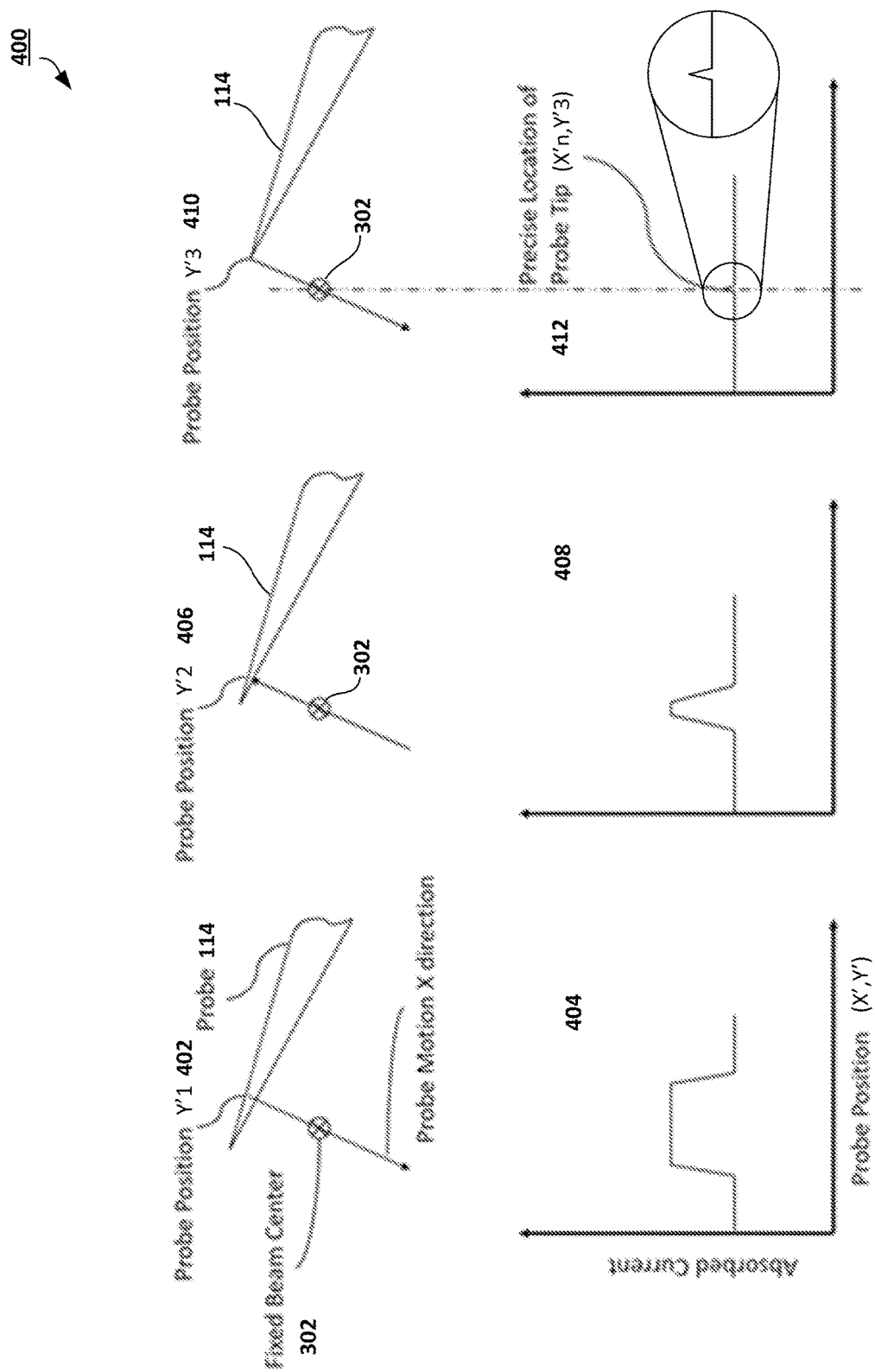
FIG. 4 is a schematic diagram of an example current absorption profile for various portions of the probe tip in accordance with embodiments of the present disclosure.

In a first example embodiment illustrated in FIGS. 3-4, determination of a probe tip location is performed with a static, non-moving, charged particle beam is described (e.g., CPB in spot mode). The second example embodiment illustrated in FIGS. 5-6 describes determination of the probe tip location or a plurality of probe tips locations by holding the probe tip position fixed while moving the charged particle beam in a linear direction of motion that crosses the probe tip's Y axis. The third example embodiment illustrated in FIG. 7 describes determination of a probe tip location or the location of multiple probe tips by holding the probe or probes position fixed while moving the charged particle beam with a circular motion so that the beam will cross each of the probe's independent Y axis. The fourth example embodiment describes how these techniques are used to locate the probe tip or a plurality of tips along the Z axis of the CPB system. The fifth example embodiment describes how the techniques described herein are used to calibrate the scale and angle of motion of the probe tip positioning mechanism.

In each embodiment, the system will monitor each probes absorbed or scattered charge and record the charged particle beam's position at the moment the monitored value indicates the beam is coincident with each probe tip, thus locating the probe tip or a plurality of probe tips without image processing. An example absorbed current profile compared against probe intersection position in shown in FIG. 4.

These embodiments facilitate fully automated sample inspection by the nanoprober within charged particle beam systems.

Returning briefly to FIGS. 1A-1B, the system includes a charged particle beam imaging system that includes a location encoded sample stage and supports a location encoded positioning system internal to a vacuum chamber. The location encoded positioning system holds and moves probe tips for electrical testing of a sample mounted on the sample stage. For the probe tip location function described herein, a current monitor (signal measurement circuitry) is connected to the probe tip for charge current measurements. These measurements are used to determine the coincident location of the probe tip and the charged particle beam.

The following can be performed by an operator to calibrate the system or by a computer running an algorithm. For example, a measurement and control system can include circuitry to receive a signal indicative of charge absorbed by the probe from the CPB. The signal can be sent to a control system to move the probe tip until a predetermined absorption profile is attained, indicating the probe tip is intersecting the CPB. The control system can include circuitry and software to automatically move the probe in a snake scan or raster until the probe tip is located. Once the probe tip is located, the control system can continue moving the tip to verify the probe tip location (e.g., move the probe tip so it does not intersect the CPB and then move it into the CPB again) or the control system can stop move the probe tip.

Similarly, a control system for the CPB can move the CPB until the probe tips are located.

First Embodiment: Moving Probe & Stationary Beam

FIG. 3 is a schematic diagram 300 of an example probe tip coordinate system overlaid onto a sample stage coordinate system in accordance with embodiments of the present disclosure. In FIG. 3, the probe tip 114 is moved while the CPB 302 is held static (e.g., in spot mode). The sample stage 110 has a sample stage reference frame 308 that is shown. The sample stage coordinate reference frame 308 is not the same as the CPB imaging system coordinate frame. The probe tip coordinate reference frame 306 is shown as the X'-Y' frame.

At the outset, in the interest of protecting the sample and the probes, the target sample can be lowered (e.g., Z-direction) below the intended working plane to avoid unintentional and uncontrolled probe tip and sample contact. If Z-axis mapping of the probe tips have been performed, the target sample can be lowered a minimum amount or this step can be skipped.

The CPB 302 is set to a static known position so that when the moving probe tip 114 encounters the static CPB 302, the probe 114 is detected by the current monitoring system. For example, the CPB 302 could be positioned with a static location of the beam to the center of the beam X-Y scan range (beam origin) or at some location offset from the beam origin away from the DUT. In some embodiments, setting the CPB to a static position is known as spot mode. The amount of charge emitted by the beam can be predetermined based on the requirements of the system or other factors.

The CPB 302 focus is set to the intended working plane where the probe tips are expected to be located along the CPB Z-axis. The function of locating the probe tips with the highest resolution will be where the beam focus and the probe tips are at the same location along the CPB Z axis. Noteworthy is that the probe will absorb charge independent of the beam focal plane; but the charge density from the beam is highest at the focal plane.

The probe 114 is moved by the motion control system in a direction along the probe's Y' axis (tip longitudinal axis) into the beam X-Y scan range so that the probe tip will eventually meet the static CPB 302. Also, the probe 114 can move in the X' and −X' direction until the tip of the probe 114 intersects the CPB 302. To find the tip of the probe 114, the motion of the probe tip 304 is characterized by a step-wise raster translation in the X'-Y' plane. This movement can be done using coarse or fine actuation. The direction of movement is arbitrary and other implementation choices can be used. Also, the reference frame directions (X' and Y' and Z') are also arbitrary. The motion of the probe tip 304 can alternate along the plus and minus X' axis (orthogonal to the probe tip Y' and Z' axis) direction. After the probe tip completes its alternating plus and minus probe tip X' axis movement, the probe tip Y' axis will retract a small defined amount (e.g., the probe tip moves like a snake scan or modified raster scan).

The charged particle current absorbed by the probe 114 can be monitored using a high-gain, high-bandwidth current amplifier or charged particle detector. This monitored current is the net current absorbed (or scattered) by the probe 114 as it encounters the CPB 302 while translating along the probe's X' axis (for example). FIG. 4 shows the absorbed current profile for various X' positions of the probe relative to the CPB's position. Other current detection circuitry can also be used that can detect current through the probe.

The first profile 404 shows the probe 114 and the CPB 302 intersecting at a first position Y1 402. The broad cross-section of the probe 114 results in a broad current absorption profile 404. The absorbed current profile 404 can indicate to the controller system that the CPB 302 is intersecting the probe 114 but at a position away from the tip of the probe 114. The probe 114 can be moved and the absorbed current profile monitored. If the profile becomes broader, the probe has moved in a direction that puts the tip further away from the CPB 302.

If, however, the absorbed current profile becomes narrower, as shown by profile 408, when the probe 114 intersect the CPB 302 at position Y2 406, the controller system can interpret the change in profile to mean that the tip of the probe 114 is closer to the CPB 302. The controller system can cause the probe 114 to move in the same direction until the tip of the probe 114 is found. In embodiments, the probe 114 can move until no signal is detected, which means that the probe 114 does not intersect the CPB 302. The probe 114 can then move in the opposite direction to find the tip of the probe 114 as it intersects the CPB 302. The current absorption profile 412 shows an example current profile for the tip of the probe 114.

Under certain conditions, the absorbed current profile can be based on the net absorbed current, which can be positive or negative. The signal measurement circuitry can monitor the current and determine a net absorbed current from the probe-beam interaction. The signal measurement ring circuitry can, thus, monitor the change in the absorbed current from the interaction between the probe 114 and the CPB 302. The signal measurement circuitry or the computer controller can correlate the change in absorbed current with the probe 114 position. The correlation between absorbed current and probe tip position can be done using historical information about absorbed current profiles and probe intersection, along with absolute probe location information (e.g., from an encoded nanoprober). As shown in FIG. 4, the absorbed current profile 412 correlates with a location of probe tip (X'n,Y'3) 410. This location in the nanoprober reference frame can then be correlated with the CPB imager reference frame using a transformation matrix.

The absorbed current profile can be created using a net absorbed current through the probe 114. In addition (or in the alternative), the off-axis detector of the CPB imaging system (e.g., electron detector 108 of FIG. 1A) can be used to determine the probe's interaction with the beam by measuring current. The off-axis detector can be used to collect scattered electrons, for example, and instead of using those electrons to render an image, the computer system can use that data to create probe tip profile based on the values of the scattered electrons and then find probe tip using the profile. The underlying sample, however, can confuse the data, whereas using absorbed current in the probe will not have this problem. That said, for a stationary beam, the electrons from the underlying sample stage will not change as the probe moves; only the probe tip electrons change. So, these changes can be used to figure out the probe tip location by filtering or biasing the signal to address the electron values from the sample. Another advantage of using the current absorption through the probe tip is that the signal measurement circuitry can be simplified, instead of complicated and expensive imaging equipment and graphics processing software.

Moving the beam has a similar problem in that the CPB imaging system can collect information from the surface/sample below the probe. Moving the probe has an advantage in that the beam is kept fixed. The monitored current will have higher value as the translating probe tip edge encounters the CPB 302. The probe tip edges passing across the charged particle beam will correspond to the steepest slope of the monitored current. Where the CPB 302 and the probe 114 are coincident, the amplitude of the monitored current will be proportional to the CPB current per unit area.

The higher value steep edges of the monitored probe absorbed current will merge into one steep edge as the probe tip retracts in the minus probe Y' axis direction, as shown in 412. The location of the probe tip along the probe Y' axis will be indicated at the position where the probe's monitored absorbed current decreases to the baseline level and the probe tip no longer encounters the charged particle beam.

Noteworthy is that the CPB is held steady (e.g., fixed) at a known location within the CPB reference frame. This location can be used later to translate the probe tip location within the nanoprober reference frame into the CPB reference frame (and then to the DUT reference frame). Ultimately, the probe tip location is determined within the DUT reference frame to facilitate the automated landing of the probe tip onto the DUT at a desired sample location.

Second Embodiment: Moving Beam with Stationary Probe

Figure 5:
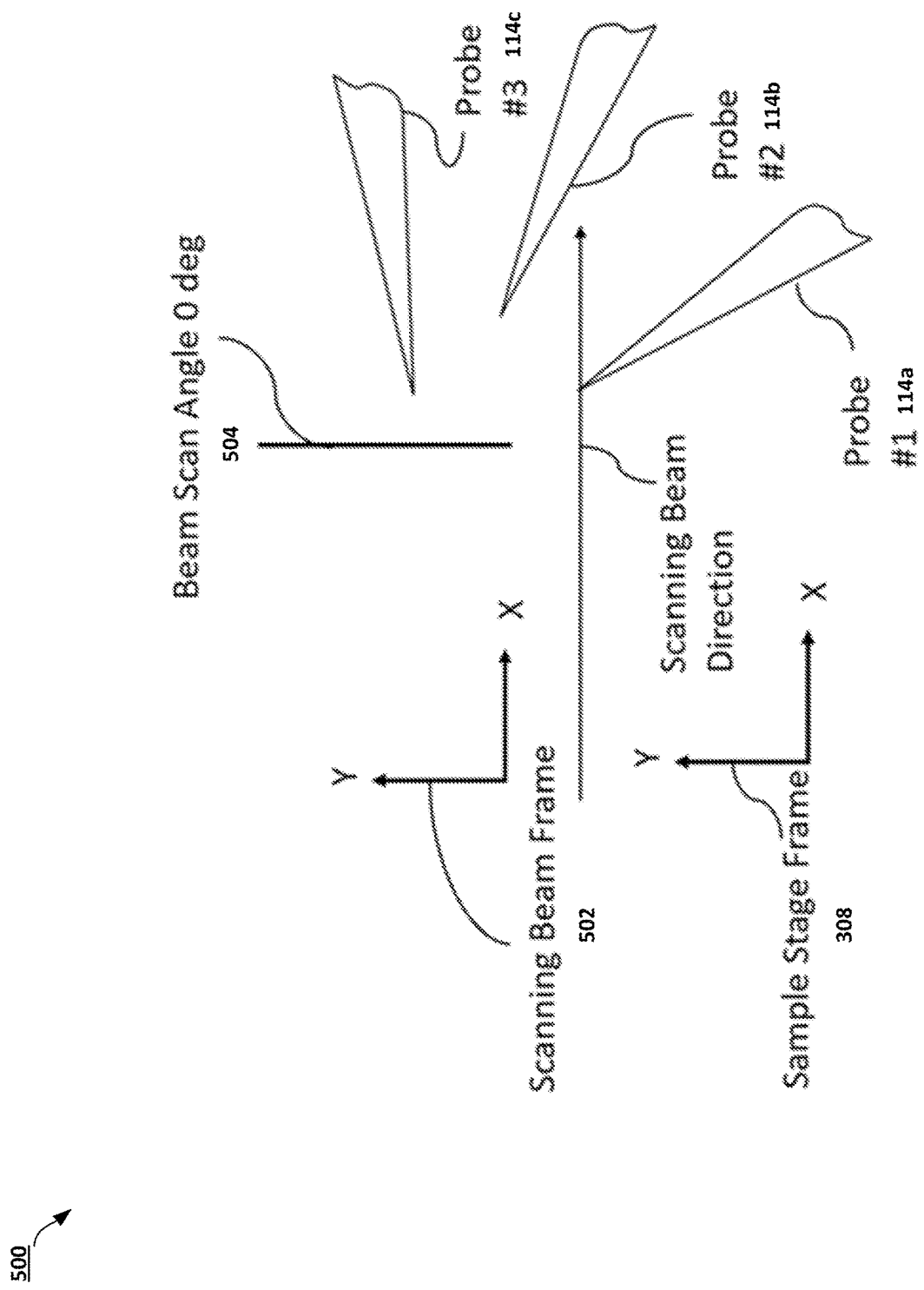
FIG. 5 is a schematic diagram of an example embodiment of a scanning electron beam at zero-degree scan angle in accordance with embodiments of the present disclosure.
Figure 6:
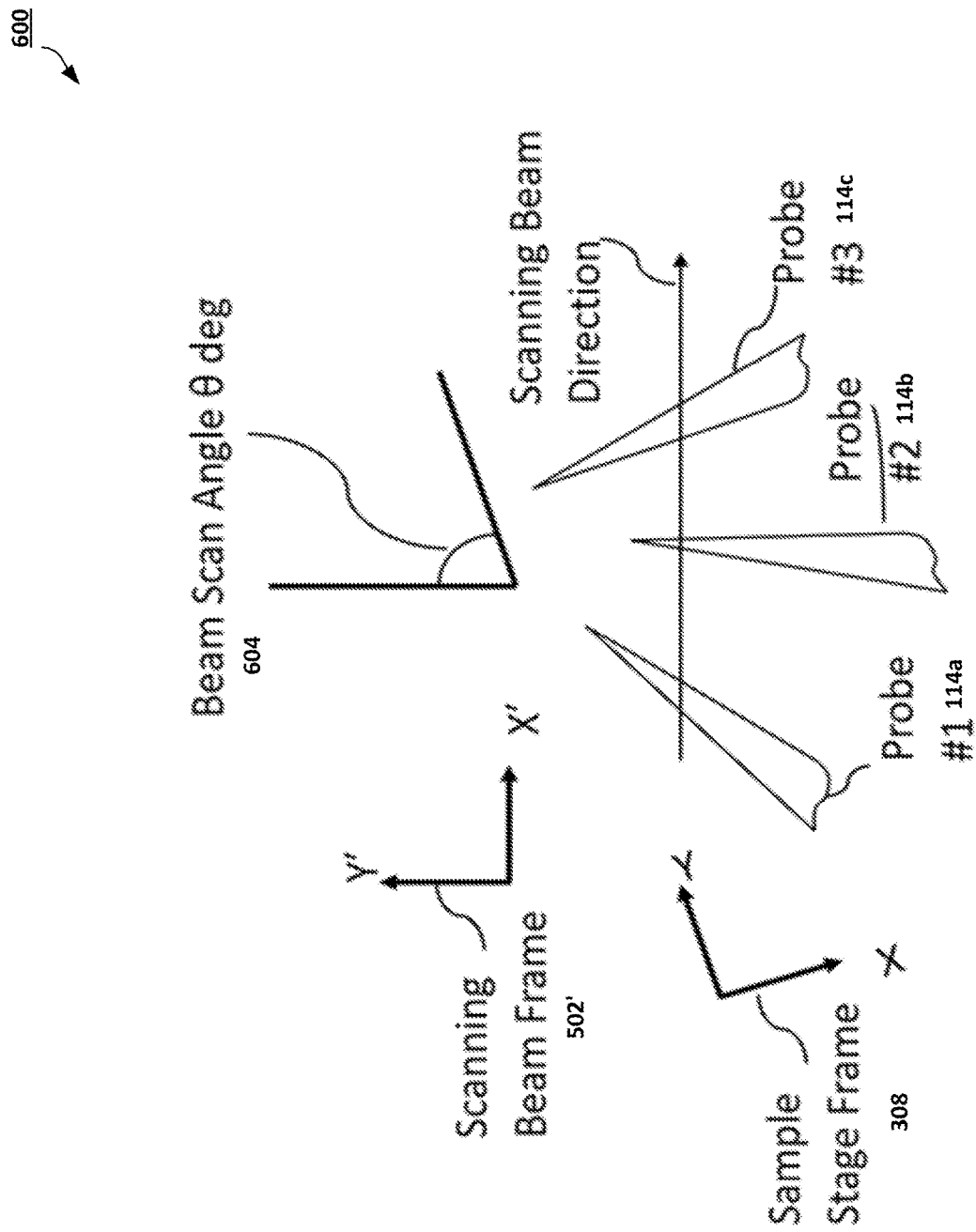
FIG. 6 is a schematic diagram of an example embodiment of a scanning electron beam at a non-zero scan angle in accordance with embodiments of the present disclosure.

FIG. 5 is a schematic diagram 500 of an example embodiment of a scanning electron beam at zero-degree scan angle in accordance with embodiments of the present disclosure. FIG. 6 is a schematic diagram 600 of an example embodiment of a scanning electron beam at a non-zero scan angle in accordance with embodiments of the present disclosure. In this embodiment, the probes are held static, while the beam is moved across each probe. To perform the moving beam with stationary probe(s) process, the target sample is lowered below the intended beam working plane. This is assuming that Z axis mapping of the probe tips has been performed. The beam is set to X-Y scan mode and the focus of the beam is set to the intended working plane. Within the uncertainty error of the known probe tip location or a plurality of probe tips locations, the probe or a plurality of probes can be positioned into the charged particle beam scan area.

FIGS. 5 and 6 show three probe tips 114a, 114b, and 114c at different positions, each having a unique X-Y coordinate frame relative to each other and to the stage frame 308 and the beam frame 502 and 502'. The CPB can have a beam scan angle relative to the sample stage frame (but also relative to the stationary probes). For example, in FIG. 5, the CPB can have beam scan angle 504 of 0 degrees relative to the sample stage frame (in FIG. 5, the beam scan angle is parallel to the X axes of both the scanning beam frame 502 and the sample stage frame 308). This beam scan angle 504 represents the angle of the beam scan direction relative to the sample stage frame. In FIG. 5, the CPB scans at an angle 0 degrees relative to the X axis of the sample stage frame.

As seen in FIG. 5, probe #3 114c would be difficult to locate using the absorbed current profile described herein if the beam scan angle 502 is set to 0 degrees. The probe's angle with respect to the beam X axis is too shallow to provide the expected behavior of the monitored absorbed current.

In FIG. 6, the beam scan angle 604 is set to θ (theta) so that the beam X' axis in the scanning beam frame 502' is roughly orthogonal to a single probe or a group of probes, where θ is non-zero. In FIG. 6, the scan direction is along the X' axis of the scanning beam frame 502', essentially, rotating the scanning beam frame by θ. Probe #3 114c is now a suitable addition to the group of probes with the scan angle θ.

The beam can be scanned in the X' direction (scanning beam X' direction) back and forth while slowly changing the beam Y' axis position. Scanning the beam in the X' direction with a fast return (or flyback) or beam blanking during the return is also a suitable method.

The probe tip absorbed charged particle current can be monitored using a high gain, high bandwidth current amplifier or charged particle detector or other type of signal measurement circuitry. This monitored current is the current absorbed or scattered by the probe tip as the beam moves in the beam X' axis and encounters the stationary probe tip. (See, e.g., FIG. 4.) The monitored current will have higher value as the translating charged particle beam encounters the probe tip edges. The charged particle beam passing across the probe tip edges will correspond to the steepest slope of the monitored current.

While the charged particle beam translates alternating in the plus and minus beam X' axis, the beam Y' axis will advance roughly along the probe or group of probes. The higher value steep edges of the monitored probe absorbed current will merge into one steep edge as the beam advances in the positive probe Y axis direction.

The location of the probe tip along the probe Y axis will be indicated at the position where the probe absorbed current decreases to the baseline level and the charged particle beam no longer encounters the probe tip. Each probe 114a, 114b, and 114c can be independently monitored since each probe has its own channel to the signal measurement circuitry. Therefore, three current absorption profiles can be created to determine the location of each probe tip independently (i.e., within their own reference frames). Each probe tip location can then be correlated to other reference frames using a transformation matrix.

Third Embodiment: Circular Motion of Beam and a Plurality of Stationary Probes

Figure 7:
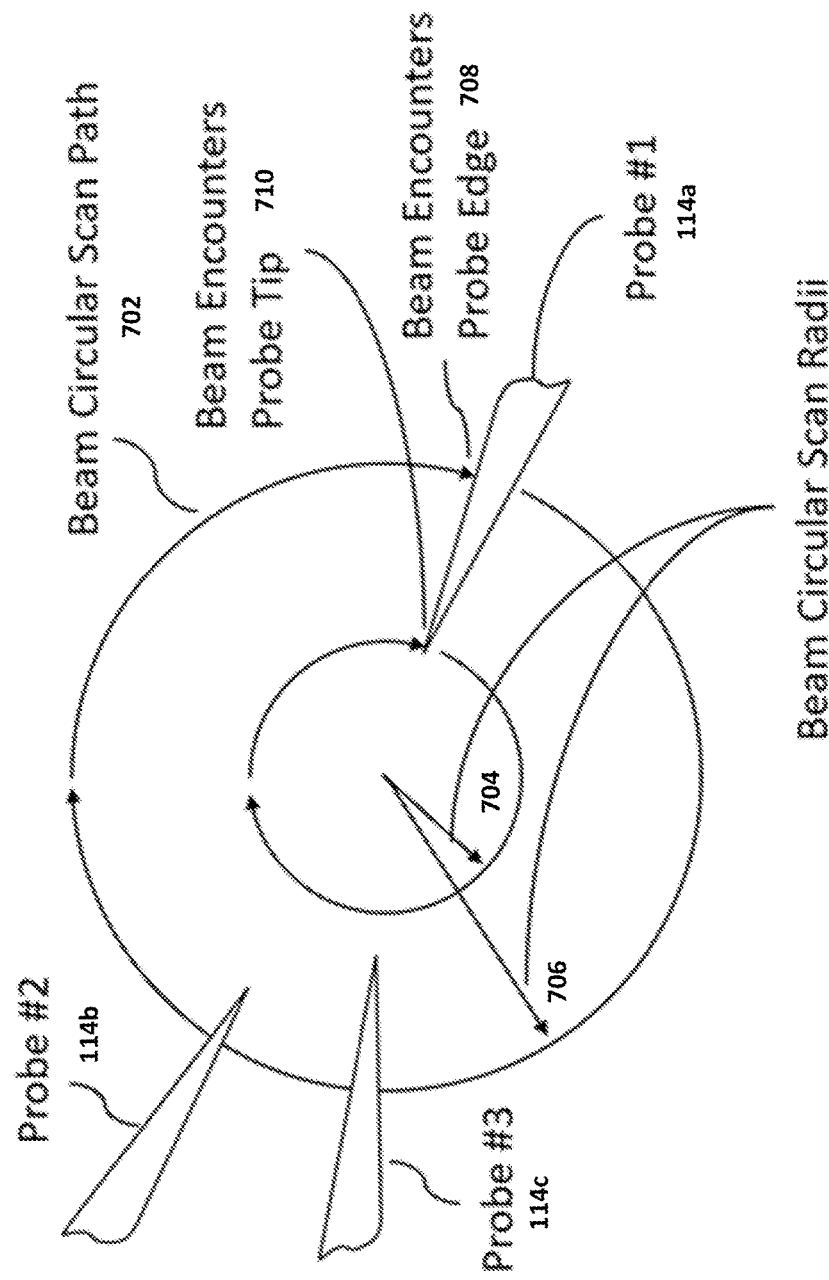
FIG. 7 is a schematic diagram of an example embodiment using a circular scanning pattern in accordance with embodiments of the present disclosure.

FIG. 7 is a schematic diagram 700 of an example embodiment using a circular scanning pattern 702 in accordance with embodiments of the present disclosure. Moving the beam in a rotational way gives a higher likelihood of probe CPB intersection orthogonality as compared to assigning an arbitrary beam scan angle. By using a rotational movement and changing the radius of curvature of the rotational motion of the CPB, multiple probes can be accurately located in one process.

At the outset, target sample is lowered below intended beam working plane. This is assuming that Z axis mapping of the probe tips has been performed. The CPB can be set to radial scan mode. This mode moves the beam in an arch with motion that is always tangential to a circle with a given radius. The focus of the beam can be set to the intended working plane.

Within the uncertainty error of the known probe tip location or a plurality of probe tips locations from nanoprober encoding, the probe or a plurality of probes can be positioned into the charged particle beam scan area.

The beam scan radius 706 can be set to be large enough to encounter all probes that have been moved into the scan area and the beam can be moved (scanned) in an arch with a given radius. The probe tip absorbed charged particle current can be monitored using a high gain, high bandwidth current amplifier or charged particle detector. This monitored current is the current absorbed or scattered by the probe tip as the beam moves in an arch of a given radius and encounters the stationary probe tip. The monitored current will have higher value as the translating charged particle beam encounters the probe tip edges. The charged particle beam passing across the probe tip edges will correspond to the steepest slope of the monitored current.

While the charged particle beam translates in an arch of a given radius, the beam will encounter all the probe tip edges (e.g., edge 708 of probe 114a) roughly parallel to each of the probe X axis and roughly orthogonal to each of the probe Y axis. After the beam makes one or more circular passes and after encountering each probe that is in the beam scan area, the beam will then scan a new smaller arch by decreasing the scan radius to radius 704 until the probe tip 710 absorbed charged particle current indicates the probe tip. The higher value steep edges of the monitored probe absorbed current will merge into one steep edge as the beam scan radius decreases to a minimal value.

The location of the probe tip will be indicated at the position where the probe absorbed current decreases to the baseline level and the charged particle beam no longer encounters the probe tip.

Figure 8:
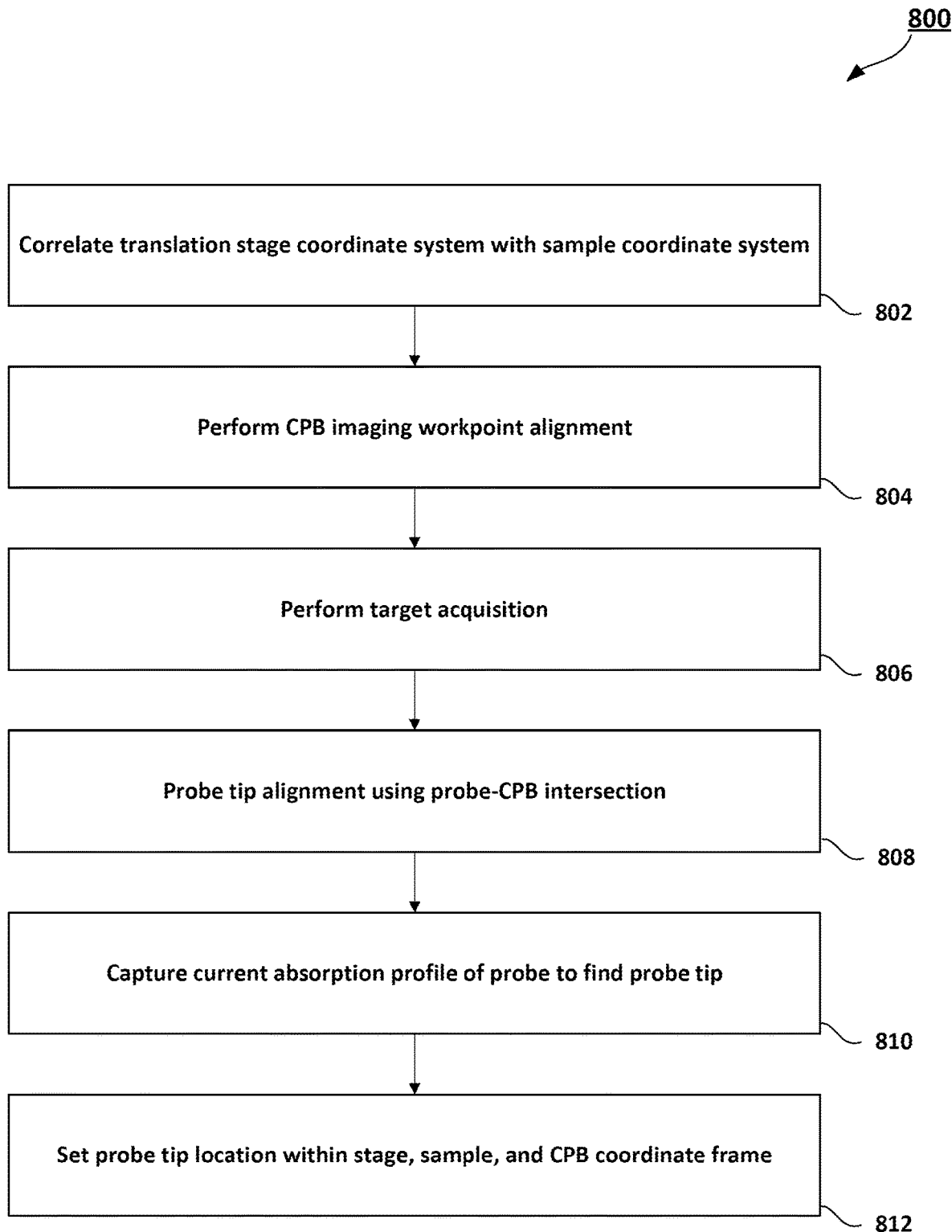
FIG. 8 is a process flow diagram for performing in situ probe tip X-Y location coordination in accordance with embodiments of the present disclosure.

FIG. 8 is a process flow diagram 800 for performing in situ probe tip X-Y location coordination in accordance with embodiments of the present disclosure. At the outset, the Global Alignment process is performed. The sample (translation) stage reference frame (i.e., coordinate system) is correlated with the sample reference frame (802). The sample stage reference frame is the same as the CPB imaging system reference frame. CPB imaging system workpoint alignment is performed (804). For example, the rotation, centering (translation), magnification, and perpendicularity for the CPB imaging system are calibrated for each workpoint. CPB workpoint alignment can be performed before, after, or during global alignment. Target acquisition is performed (806) The image of the sample is taken and compared against the CAD map of the printed pattern. Image sizes are directly related back to the CAD through a transformation matrix to accurately locate each feature of the sample.

The stage-to-sample reference frame correlation can be performed prior to the start of DUT analysis. A coarse alignment procedure can be used by identifying certain large-scale identifying characteristics of the sample, such as a notch or flat. The coarse alignment can be performed using visual inspection of the sample (e.g., by an operator or robot). The sample can then be imaged using the CPB imaging system to identifying one or more features of interest that indicate known locations on the sample. A first feature can be identified using the CPB imaging system, which along with the coarse alignment, can be used to identify a location on the sample in absolute X-Y coordinates using information from the CAD map of the sample. A second feature of interest can also be identified using the same process. By identifying the second feature of interest, the X-Y locations of each can be verified.

In addition, the relative scale of the sample can be identified. That is, the difference in the X-Y positions of the first and second features of interest can be used to determine the distance between them. This distance can be used to determine how much the sample stage can move within the sample's reference frame to position the DUT relative to the CPB or the nanoprober probe for testing. For example, the sample stage is used to position the DUT under (or close to under) the CPB at a given working distance (Z position). The sample stage does move, however, in the X-Y plane to position DUT in a position for the DUT to be analyzed, which can mean one or both of positioning the DUT beneath the CPB or positioning the DUT within reach of the probe. In an automated system, the motion control system uses the scale information determined from planar localization of two features of interest to determine how much to move the stage to position any given DUT on the sample at a desired location. The coarse alignment, position information, and scale can be used to construct or update a transformation matrix. The coordinate system of the CPB imaging system translation stage correlated with the coordinate system of the sample (e.g., using the CAD map of the patterned wafer). The sample stage has its own encoded coordinate system. Once the sample is aligned, the absolute X-Y values of the sample stage can be correlated with the sample.

Probe tip alignment is then performed using one of the procedures outlined above. (808). That is, the probe and the CPB are intersected. Charge absorption (or current) is measured to profile probe and locate tip in the nanoprober reference frame (810). As mentioned above, each nanoprober is encoded with its own X-Y coordinates. Thus, the nanoprober tracks the position of the probe in absolute terms within its own reference frame. Location of tip can be correlated back to the reference frames of the CPB beam, stage, and sample (812). After the probe tip is located (for each nanoprober to be used in the analysis) and the probe tip location is correlated to the CPB imaging system reference frame using the transformation matrix (or other relational techniques), the nanoprober can perform automated motion control, including landing the probe tip onto a targeted feature of the DUT.

High-Resolution Probe Mapping

Figure 9:
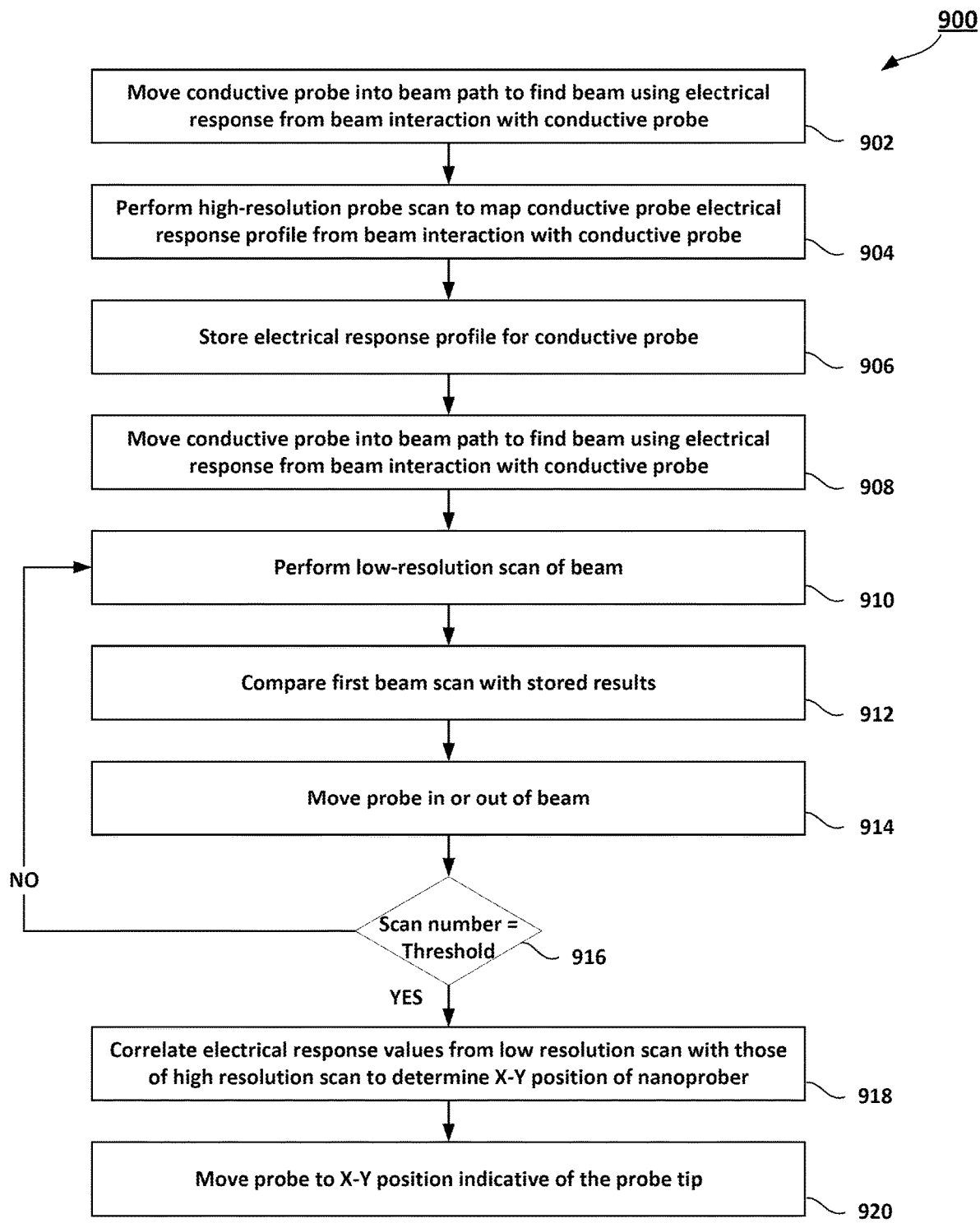
FIG. 9 is a process flow diagram for obtaining high-resolution current data of a probe in accordance with embodiments of the present disclosure.

FIG. 9 is a process flow diagram 900 for obtaining high-resolution current data of a probe in accordance with embodiments of the present disclosure. Generally, the high-resolution scan involves taking electrical response data at X positions of the probe for a set of Y positions, including a set of Y positions at or near the probe tip. Later, when performing an automated task with the probe and the probe tip needs to be located, the electrical response from this second round of probe tip localization can be compared against the high-resolution scan to quickly find the probe tip. Table 1 represents an example high resolution probe electrical profile:

TABLE 1

High-resolution Probe Electrical Profile (pseudo-data)
Probe 1 Current Profile (picoamps)

| Ym | Xn | Xn + 1 | Xn + 2 | Xn + 3 | Xn + 4 | Xn + 5 | Xn + 6 |
|---|---|---|---|---|---|---|---|
| Ym | .7 | .9 | 1.1 | 1.5 | 1.2 | 1.0 | .6 |
| Ym-1 | .4 | .9 | 1.0 | 1.5 | 1.1 | .8 | .3 |
| Ym-2 | .2 | .8 | 1.0 | 1.5 | 1.0 | .8 | .2 |
| Ym-3 | 0 | .6 | 1.0 | 1.5 | 1.0 | .7 | 0 |
| Ym-4 | 0 | .4 | .9 | 1.5 | 1.1 | .4 | 0 |
| Ym-5 | 0 | 0 | .7 | 1.5 | .8 | 0 | 0 |
| Ym-6 | 0 | 0 | .3 | 1.5 | .2 | 0 | 0 |
| Ym-7 | 0 | 0 | 0 | 1.5 | 0 | 0 | 0 |
| Ym-8 | 0 | 0 | 0 | 1.0 | 0 | 0 | 0 |
| Ym-9 | 0 | 0 | 0 | .8 | 0 | 0 | 0 |
| Ym-10 | 0 | 0 | 0 | .3 | 0 | 0 | 0 |
| Ym-11 | 0 | 0 | 0 | 0 | 0 | 0 | 0 |

Table 1 establishes a baseline or current values template that is used to determine where the probe and CPB intersect at a later time. Such a determination facilitates the probe motion control automation. For example, during a later probe motion process, such as probe landing, the probe tip location is to be identified automatically. The probe tip location identification can include a faster, low-resolution scan of the probe within the CPB region. The resulting net absorbed current values measured during the "low-resolution" scan can be compared against the predetermined baseline or template values to quickly ascertain the location of the probe.

Because the probe narrows to a point along the Y direction, as the probe is moved in the −Y direction (i.e., the probe is pulled away from the CPB), the CPB intersects a smaller cross-section of the probe. The current profile shows the probe tip profile as diminishing current values for each X-Y position. Eventually, the CPB and probe no longer intersect, as shown in Ym-11, and all X position value go to zero. Thus, the probe tip profile can be characterized as being located at Y positions that have the fewest non-zero X position values. Another way would be to look at the first Y position with all zero values (Y) and taking the probe tip as being located at the Y position immediately adjacent to Y(0) with at least one non-zero value of Xn.

At the outset, new probes are loaded into the nanoprober system, which is in a CPB system; the CPB system is brought to operational conditions, such as to vacuum. Activating the automating probe landing cycle can first turn on electrical circuitry, such as the signal measurement circuitry, including amplifiers, which start looking for current. The motion control system can move the conductive probe in the Y direction into the CPB beam region somewhere by some number of microns and scan in the X direction (902). The signal measurement circuitry can determine when the probe is detected by a process as described herein (e.g., by looking at net absorbed current from the probe, looking at a net absorbed current from the sample, looking at current from other detectors, etc.). When current is detected by the signal measurement circuitry, the processor can determine that the probe has generally been located.

The nanoprober system can then perform a high-resolution scan to map the conductive probe's electrical response profile from the beam's interaction with the conductive probe (904). For each value of Y, starting at the first value of Y from discovering the probe, an electrical response value for each position in X is recorded. The motion control system can move the probe in a negative Y direction (away from the CPB), and scan in the X direction (like a raster scan). For each Y value, the signal measurement circuitry measures a corresponding electrical response value for each X position. The motion control system draws back in Y direction, sweeping in X, until the tip of the probe is found.

While sweeping in the X direction, the current (or other electrical value) for each X position is logged (906). The electrical response data from the X-direction sweep all the way down the probe. When the CPB passes the tip, the current will be zero. The motion control system can move the probe in the Y direction to verify the probe tip location. This electrical response mapping can provide a high-resolution mapping of the electrical response profile of the conductive probe (e.g., a current value is identified to a plurality of X-Y locations on the probe).

At another point in time (e.g., during probe tip landing process for DUT testing), the conductive probe can be moved in the Y direction into the CPB region and scanned in the X direction until the CPB intersects the conductive probe (908). The motion control system can then perform a low-resolution scan of the probe (910). The motion control system can scan in the X direction, and the signal measurement circuitry can measure the electrical response from the beam's interaction with the probe. The computer processor can compare the electrical response from this scan with stored data to identify a possible X-Y location (912). The motion control system can then move the probe in the Y direction to perform another X-direction scan (914). Unlike the high-resolution scan, the low-resolution scan can be performed for a smaller subset of Y-axis positions along the probe. The number of Y-axis position scans can be set by the operator, for example. Typically, 1-5 scans are sufficient to uniquely identify the position of the probe tip. If the desired number of Y-axis position scans has not reached (916), then the process repeats at (910). After a desired number of scans has been reached, the location of the probe tip can be identified by correlating the electrical response values from the low-resolution scans with the electrical response values from the high-resolution scan (918). The motion control system can then move the nanoprober to the X-Y position that corresponds to the probe tip location (920).

Probe Tip Location in Z Axis

Figure 10A:
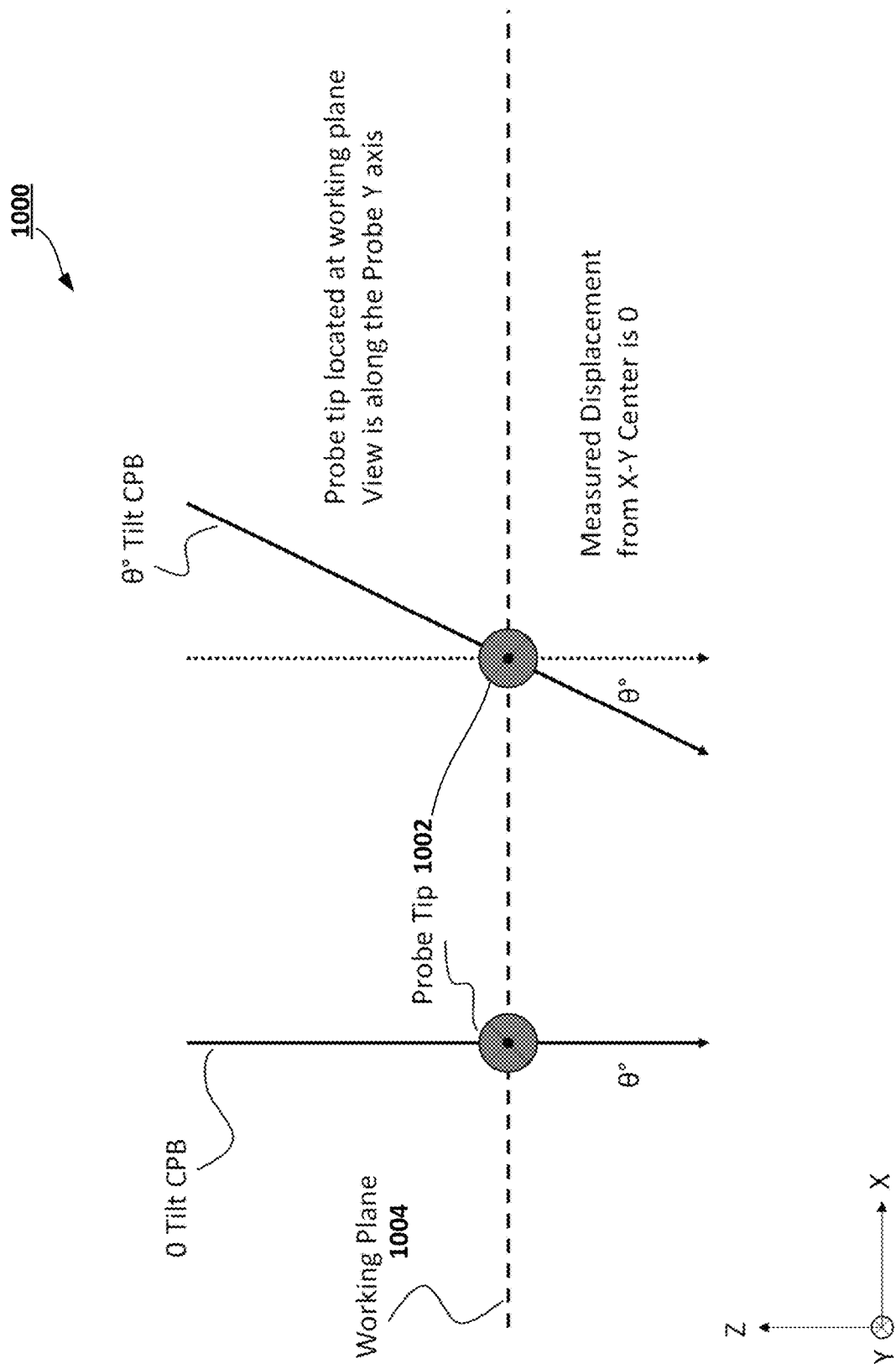
FIGS. 10A-B are schematic diagrams of probe tip Z location identification in accordance with embodiments of the present disclosure.
Figure 10B:
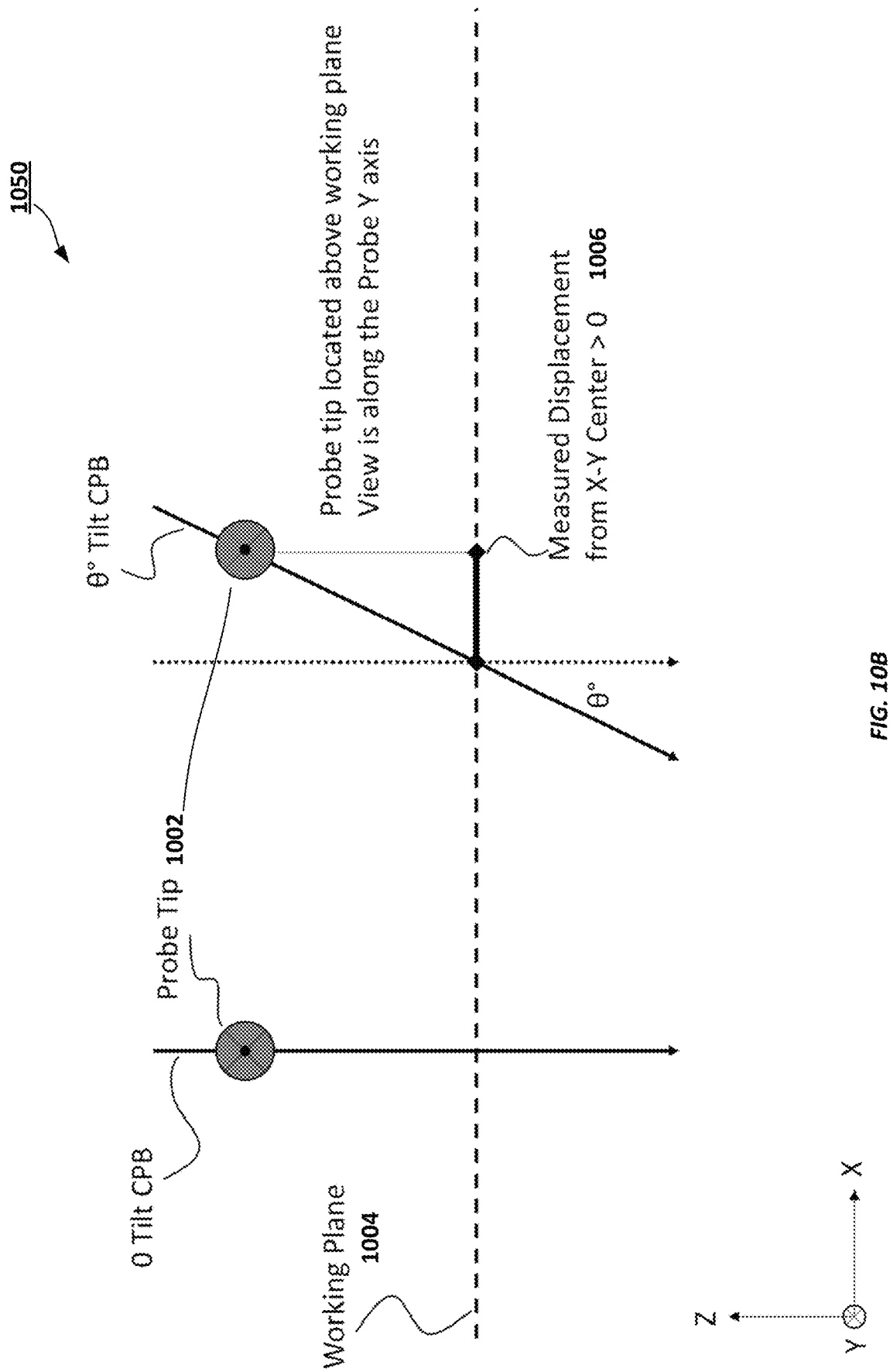

Z-axis mapping includes locating the probe tip location along the Z axis. The intended working plane is also the location of the focus of the charged particle beam. X-Y mapping of the probe tip would not be accurate if the probe tip was outside the charged particle beam's depth of field, below or above the charged particle beam focus. FIGS. 10A-B are schematic diagrams 1000, 1050, of probe tip Z location identification in accordance with embodiments of the present disclosure. In FIG. 10A, the probe tip 1002 has been positioned in the working plane 1004, which is where the probe tip 1002 can be prior to performing X and Y probe tip location identification or performing reference frame mapping (though X-Y mapping could be performed without performing Z-axis work-point alignment). As shown in FIG. 10A, while the probe tip is positioned in the working plane, any tilting of the CPB will not result in a change to where the CPB intersects the probe. That is, the measured displacement from the X-Y center during CPB tilting is 0 or close to 0. Whereas, as shown in FIG. 10B, if the probe tip 1002 is not positioned in the working plane 1004, then tilting the CPB will result in an X-Y displacement 1006. FIGS. 10A-B illustrates the reference frames discussed in this section.

To verify Z-axis work-point alignment of the probe, the CPB Z axis is tilted with respect to the probe tip positioner Z axis to a different tilt angle. This can be done by electronically adjusting the angle that the CPB moves along the Z axis of the CPB optical lens column assembly or, the CPB optical lens column assembly can mechanically tilt with respect to the probe tip Z axis.

A probe tip is mapped as measurement #1 in the CPB X-Y coordinate system by employing any of embodiments described here. While the CPB is tilted, the probe tip is mapped as measurement #2 in the CPB X-Y coordinate system by any of the three methods described above. The difference between probe tip measurement #1 and probe tip measurement #2 on the CPB X-Y plane represents the probe tip's location along the CPB un-tilted Z axis.

The probe tip can be moved along the CPB un-tilted Z axis to the position where the difference between measurement #1 and measurement #2 is minimized. This can be done by repeating the above process until the difference is minimized or calculating and executing a single move of the probe tip along the CPB un-tilted Z axis.

Once the difference is minimized, the probe tip is located on the chosen probing plane. This process can be done on a single probe tip or a plurality of probe tips simultaneously.

The Z-axis alignment can be done by automatically landing the probe tip onto a large conductive surface that is located at a known Z location e.g., using an encoded stage.

Probe Axis Motion Calibration

Figure 11:
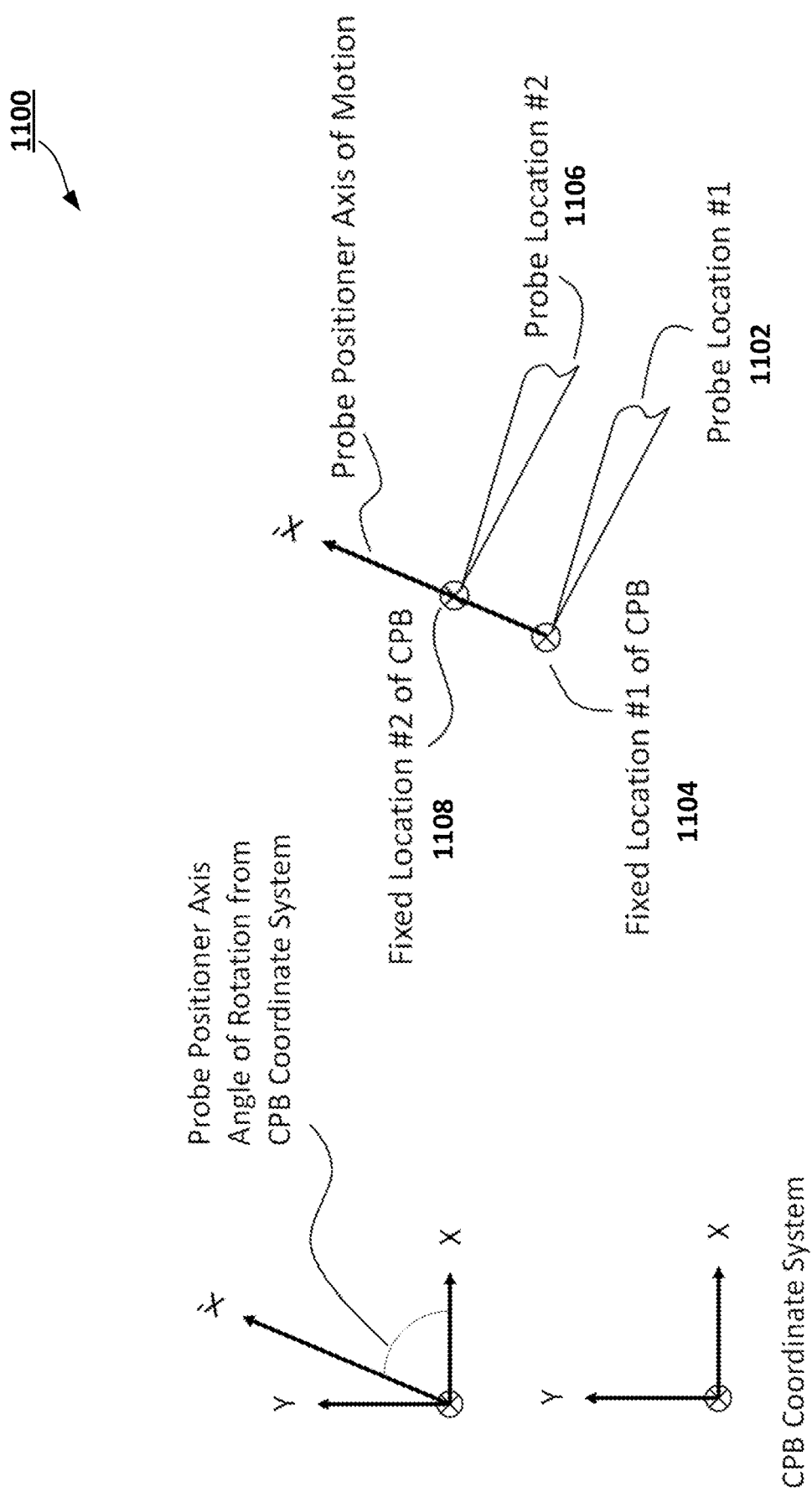
FIG. 11 is a schematic diagram illustrating correlating probe tip physical displacement with X and Y position displacement in a reference frame in accordance with embodiments of the present disclosure.

FIG. 11 is a schematic diagram 1100 illustrating correlating probe tip physical displacement with X and Y position displacement in a reference frame in accordance with embodiments of the present disclosure. Probe motion axis orthogonality, scale, and rotation can be determined by measuring a probe tip's location using methods of embodiments described herein, and then displacing the probe tip by a defined amount to a new location and measuring its location a second time. The simplest probe tip position displacement would be along only one probe tip axis. However, multiple axis could be moved simultaneously for a more complex calculation. The measured displacement and angle of motion is used to calculate and map the probe tip's motion axis to the CPB coordinate system. This process can be done on a single probe tip or a plurality of probe tips simultaneously.

An example of how the process using the First Embodiment would proceed is illustrated in FIG. 11. The CPB is positioned by the control system at Fixed Location #1 1104 and is within the range of motion of a single probe needing motion calibration, where the probe is at location #1 1102. The probe then searches for the fixed CPB by way of the First Embodiment. The probe tip location is recorded at Probe Location #1 1102 when the probe tip is coincident with the CPB at CPB Fixed Location #1 1104. The control system then repositions the CPB at Fixed Location #2 which is still within the range of motion of the probe. The probe then searches a second time for the fixed CPB by way of the First Embodiment. The probe tip location is recorded at Probe Location #2 1106 when the probe tip is again coincident with the CPB at Fixed Location #2 1108. This process may be repeated as many times as necessary until sufficient data is collected to determine mathematically the probe motion axis orthogonality, scale, and rotation with respect to the CPB coordinate system.

Probe Shadow

Figure 12:
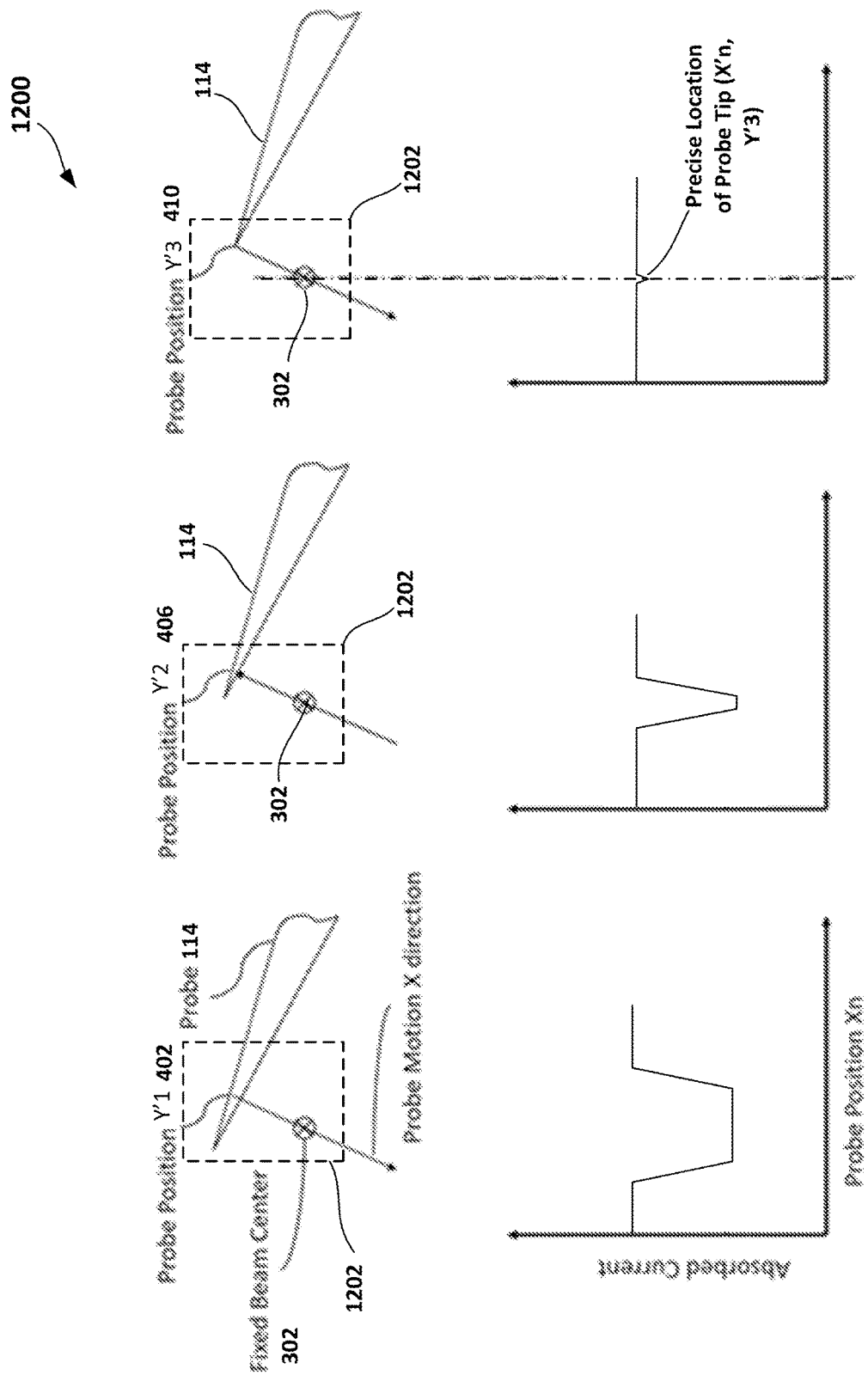
FIG. 12 is a schematic diagram of an example of an inverse electrical response profile of a probe for probe tip location identification in accordance with embodiments of the present disclosure.

FIG. 12 is a schematic diagram 1200 of an example of an inverse electrical response profile of a probe for probe tip location identification in accordance with embodiments of the present disclosure. In some embodiments, the signal measurement circuitry can be coupled to the sample stage 1202. Instead of measuring net current through the probe, net current can be measured through the sample stage 1202. In FIG. 12, as the probe and CPB change relative position, and intersect (whether the probe is moving or the CPB), the CPB can interact with the sample or the sample stage. The CPB can cause a current to flow, which is measured by the signal measurement circuitry. As the probe 114 blocks the beam 302, the sample stage 1202 does not receive any charge and the resulting net absorbed current drops. In some embodiments, the use of the probe shadow technique can be used to perform X-Y location identification, high-resolution probe profiling, and other automated probe identification processes. For high-resolution mapping of the sample, 0 values for each X-Y position can represent the probe, and non-zero values can represent the stage 1202.

The word "exemplary" is used herein to mean "serving as an example, instance, or illustration." Any embodiment described herein as "exemplary" is not necessarily to be construed as preferred or advantageous over other embodiments.

As used within this document, the term "communicate" is intended to include transmitting, or receiving, or both transmitting and receiving. This may be particularly useful in claims when describing the organization of data that is being transmitted by one device and received by another, but only the functionality of one of those devices is required to infringe the claim. Similarly, the bidirectional exchange of data between two devices (both devices transmit and receive during the exchange) may be described as "communicating," when only the functionality of one of those devices is being claimed. The term "communicating" as used herein with respect to a wireless communication signal includes transmitting the wireless communication signal and/or receiving the wireless communication signal. For example, a wireless communication unit, which is capable of communicating a wireless communication signal, may include a wireless transmitter to transmit the wireless communication signal to at least one other wireless communication unit, and/or a wireless communication receiver to receive the wireless communication signal from at least one other wireless communication unit.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or in any other manner.

Some embodiments may be used in conjunction with various devices and systems, for example, a personal computer (PC), a desktop computer, a mobile computer, a laptop computer, a notebook computer, a tablet computer, a server computer, a handheld computer, a handheld device, a personal digital assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless access point (AP), a wired or wireless router, a wired or wireless modem, a video device, an audio device, an audio-video (A/V) device, a wired or wireless network, a wireless area network, a wireless video area network (WVAN), a local area network (LAN), a wireless LAN (WLAN), a personal area network (PAN), a wireless PAN (WPAN), and the like.

Some embodiments may be used in conjunction with one way and/or two-way radio communication systems, cellular radio-telephone communication systems, a mobile phone, a cellular telephone, a wireless telephone, a personal communication system (PCS) device, a PDA device which incorporates a wireless communication device, a mobile or portable global positioning system (GPS) device, a device which incorporates a GPS receiver or transceiver or chip, a device which incorporates an RFID element or chip, a multiple input multiple output (MIMO) transceiver or device, a single input multiple output (SIMO) transceiver or device, a single input single output (SISO) transceiver or device, a multiple input single output (MISO) transceiver or device, a device having one or more internal antennas and/or external antennas, digital video broadcast (DVB) devices or systems, multi-standard radio devices or systems, a wired or wireless handheld device, e.g., a smartphone, a wireless application protocol (WAP) device, or the like.

Certain aspects of the disclosure are described above with reference to block and flow diagrams of systems, methods, apparatuses, and/or computer program products according to various implementations. It will be understood that one or more blocks of the block diagrams and flow diagrams, and combinations of blocks in the block diagrams and the flow diagrams, respectively, may be implemented by computer-executable program instructions. Likewise, some blocks of the block diagrams and flow diagrams may not necessarily need to be performed in the order presented, or may not necessarily need to be performed at all, according to some implementations. Certain aspects of the disclosure may take the form of an entirely hardware embodiment, an entirely software embodiment (including firmware, resident software, micro-code, etc.), or an embodiment combining software and hardware aspects that may all generally be referred to herein as a "service," "circuit," "circuitry," "module," and/or "system."

The computer-executable program instructions may be loaded onto a special-purpose computer or other particular machine, a processor, or other programmable data processing apparatus to produce a particular machine, such that the instructions that execute on the computer, processor, or other programmable data processing apparatus create means for implementing one or more functions specified in the flow diagram block or blocks. These computer program instructions may also be stored in a computer-readable storage media or memory that may direct a computer or other programmable data processing apparatus to function in a particular manner, such that the instructions stored in the computer-readable storage media produce an article of manufacture including instruction means that implement one or more functions specified in the flow diagram block or blocks. As an example, certain implementations may provide for a computer program product, including a computer-readable storage medium having a computer-readable program code or program instructions implemented therein, said computer-readable program code adapted to be executed to implement one or more functions specified in the flow diagram block or blocks. The computer program instructions may also be loaded onto a computer or other programmable data processing apparatus to cause a series of operational elements or steps to be performed on the computer or other programmable apparatus to produce a computer-implemented process, such that the instructions that execute on the computer or other programmable apparatus provide elements or steps for implementing the functions specified in the flow diagram block or blocks.

Accordingly, blocks of the block diagrams and flow diagrams support combinations of means for performing the specified functions, combinations of elements or steps for performing the specified functions and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

Conditional language, such as, among others, "can," "could," "might," or "may," unless specifically stated otherwise, or otherwise understood within the context as used, is generally intended to convey that certain implementations could include, while other implementations do not include, certain features, elements, and/or operations. Thus, such conditional language is not generally intended to imply that features, elements, and/or operations are in any way required for one or more implementations or that one or more implementations necessarily include logic for deciding, with or without user input or prompting, whether these features, elements, and/or operations are included or are to be performed in any particular implementation.

Many modifications and other implementations of the disclosure set forth herein will be apparent having the benefit of the teachings presented in the foregoing descriptions and the associated drawings. Therefore, it is to be understood that the disclosure is not to be limited to the specific implementations disclosed and that modifications and other implementations are intended to be included within the scope of the appended claims. Although specific terms are employed herein, they are used in a generic and descriptive sense only and not for purposes of limitation.

The following examples pertain to embodiments in accordance with this disclosure and the claims:

Example 1 is a method performed in a charged particle imaging system, the method including activating a charged particle beam within a first reference frame, the first reference frame associated with the charge particle beam; causing, by a computerized control system, the charged particle beam and a conductive probe to intersect; measuring an electrical response from the intersection of the charged particle beam with the probe; determining a location of the probe in a second reference frame based on the electric response from the intersection of the charged particle beam with the probe, the second reference frame associated with the conductive probe; and correlating the location of the probe in the second reference frame with the first reference frame.

Example 2 may include the subject matter of example 1, wherein measuring the electrical response includes measuring a net current absorbed by the probe from the intersection of the charged particle beam and the probe.

Example 3 may include the subject matter of any of examples 1 or 2, and can also include performing a first series of probe scans through a charged particle beam region; for each of the first series of probe scans, measuring a first set of electrical responses corresponding to an intersection of the probe with the charged particle beam; creating a current profile of the probe based on the first set of electrical response from each of the first series of scans; and wherein determining the location of the probe includes performing a second series of probe scans through the charged particle beam region, the second series of probe scans including a fewer number of scans than the first series of probe scans; for each of the second series of probe scans, measuring a second set of electrical responses corresponding to an intersection of the probe with the charged particle beam; and determining a location of the probe based on a comparison of the first set of electrical responses with the second set of electrical responses.

Example 4 may include the subject matter of any of examples 1-3, wherein causing the charged particle beam and the conductive probe to intersect includes causing the charged particle beam and the conductive probe to intersect at a first position of the conductive probe; the method including measuring a first electrical response from the intersection of the charged particle beam and the conductive probe at the first position; determining that the charged particle beam and the conductive probe intersect at the first position of the conductive probe based on the measured first electrical response; causing the charged particle beam and the conductive probe to intersect at a second position of the conductive probe; measuring a second electrical response from the intersection of the charged particle beam and the conductive probe at the second position; and determining that the charged particle beam and the conductive probe intersect at the second position of the conductive probe based on the measured second electrical response.

Example 5 may include the subject matter of any of examples 1-4, wherein determining a location of the probe in a second reference frame based on the electric response from the intersection of the charged particle beam with the probe includes determining an X and Y position of the conductive probe within the second reference frame.

Example 6 may include the subject matter of example 5, and can also include correlating the X and Y position of the conductive probe within the second reference frame with a coordinate system of the first reference frame.

Example 7 may include the subject matter of example 6, and can also include correlating the X and Y position of the conductive probe within the second reference frame with a coordinate system of the first reference frame using a transformation matrix.

Example 8 may include the subject matter of any of examples 1-7, wherein activating the charged particle beam within a first reference frame includes activating the charged particle beam at a fixed, known location within the first reference frame.

Example 9 may include the subject matter of example, wherein causing the charged particle beam and the conductive probe to intersect includes moving the conductive probe to intersect charged particle beam at a first position of the conductive probe.

Example 10 may include the subject matter of any of examples 1-10, wherein causing the charged particle beam and the conductive probe to intersect includes moving the charged particle beam to intersect the conductive probe.

Example 11 may include the subject matter of example 10, wherein moving the charged particle beam to intersect the conductive probe includes determining a scan angle for the charged particle beam to intersect the conductive probe; and moving the charged particle beam to intersect the conductive probe based on the determined scan angle.

Example 12 may include the subject matter of example 10, wherein moving the charged particle beam to intersect the conductive probe includes moving the charged particle beam in a circular direction at a first radius of curvature to intersect the conductive probe at a first position of the conductive probe; determining that the charged particle beam intersects the first position of the conductive probe; moving the charged particle beam in a circular direction at a second radius of curvature to intersect the conductive probe at a second position of the conductive probe; and determining that the charged particle beam intersects the second position of the conductive probe.

Example 13 may include the subject matter of example 12, wherein the second radius of curvature is less than the first radius of curvature.

Example 14 may include the subject matter of example 12, wherein the conductive probe is a first conductive probe, the method further including determining that the charged particle beam intersects a second conductive probe at a third position of the second conductive probe; and moving the charged particle beam in a circular direction at a third radius of curvature to intersect the second conductive probe at a fourth position of the second conductive probe.

Example 15 is a system that includes an imaging system including a charged particle beam emitter to emit a charged particle beam; a nanoprober including an actuator, the nanoprober configured to secure a conductive probe; signal measurement circuitry electrically coupled to the conductive probe, the signal measurement circuit to receive signal from the conductive probe; and at least one tangible, non-transitory computer-readable medium for storing instructions that when executed cause a hardware processor to execute operations, the operations including activating a charged particle beam within a first reference frame, the first reference frame associated with the charge particle beam; causing, by a computerized control system, the charged particle beam and a conductive probe to intersect; measuring an electrical response from the intersection of the charged particle beam with the probe; determining a location of the probe in a second reference frame based on the electric response from the intersection of the charged particle beam and the probe, the second reference frame associated with the conductive probe; and determining a location of the probe in the first reference frame based on the location of the probe in the second reference frame.

Example 16 may include the subject matter of example 15, wherein measuring the electrical response includes measuring a net current absorbed by the probe from the intersection of the charged particle beam and the probe.

Example 17 may include the subject matter of any of examples 15-16, and the operations include performing a first series of probe scans through a charged particle beam region; for each of the first series of probe scans, measuring a first set of electrical responses corresponding to an intersection of the probe with the charged particle beam; creating a current profile of the probe based on the first set of electrical response from each of the first series of scans; and wherein determining the location of the probe includes performing a second series of probe scans through the charged particle beam region, the second series of probe scans including a fewer number of scans than the first series of probe scans; for each of the second series of probe scans, measuring a second set of electrical responses corresponding to an intersection of the probe with the charged particle beam; and determining a location of the probe based on a comparison of the first set of electrical responses with the second set of electrical responses.

Example 18 may include the subject matter of any of examples 15-17, wherein causing the charged particle beam and a conductive probe to intersect includes causing the charged particle beam and the conductive probe to intersect at a first position of the conductive probe; the operations including measuring a first electrical response from the intersection of the charged particle beam and the conductive probe at the first position; determining that the charged particle beam and the conductive probe intersect at the first position of the conductive probe based on the measured first electrical response; causing the charged particle beam and the conductive probe to intersect at a second position of the conductive probe; measuring a second electrical response from the intersection of the charged particle beam and the conductive probe at the second position; and determining that the charged particle beam and the conductive probe intersect at the second position of the conductive probe based on the measured second electrical response.

Example 19 may include the subject matter of any of examples 15-18, wherein determining a location of the probe in a second reference frame based on the electric response from the intersection of the charged particle beam with the probe includes determining an X and Y position of the conductive probe within the second reference frame.

Example 20 may include the subject matter of example 19, and the operations include correlating the X and Y position of the conductive probe within the second reference frame with a coordinate system of the first reference frame.

Example 21 may include the subject matter of example 20, and the operations include correlating the X and Y position of the conductive probe within the second reference frame with a coordinate system of the first reference frame using a transformation matrix.

Example 22 may include the subject matter of any of examples 15-21, wherein activating the charged particle beam within a first reference frame includes activating the charged particle beam at a fixed, known location within the first reference frame.

Example 23 may include the subject matter of example 22, and the operations also include a motion control system to control motion of the nanoprober actuator based on information received from the signal measurement circuitry, the motion of the nanoprober actuator to move the conductive probe, and wherein causing the charged particle beam and the conductive probe to intersect includes moving, by the motion control system, the conductive probe to intersect charged particle beam at a first position of the conductive probe.

Example 24 may include the subject matter of any of examples 15-23, wherein causing the charged particle beam to intersect the conductive probe includes moving the charged particle beam to intersect the conductive probe.

Example 25 may include the subject matter of example 24, wherein moving, by the motion control system, the charged particle beam to intersect the conductive probe includes determining a scan angle for the charged particle beam to intersect the conductive probe; and moving the charged particle beam to intersect the conductive probe based on the determined scan angle.

Example 26 may include the subject matter of example 24, wherein moving the charged particle beam to intersect the conductive probe includes moving the charged particle beam in a circular direction at a first radius of curvature to intersect the conductive probe at a first position of the conductive probe; determining that the charged particle beam intersects the first position of the conductive probe; moving the charged particle beam in a circular direction at a second radius of curvature to intersect the conductive probe at a second position of the conductive probe; and determining that the charged particle beam intersects the second position of the conductive probe.

Example 27 may include the subject matter of example 26, wherein the second radius of curvature is less than the first radius of curvature.

Example 28 may include the subject matter of example 26, wherein the conductive probe is a first conductive probe, the operations further including determining that the charged particle beam intersects a second conductive probe at a third position of the second conductive probe; and moving the charged particle beam in a circular direction at a third radius of curvature to intersect the second conductive probe at a fourth position of the second conductive probe.

Example 29 is an apparatus including signal measurement circuitry to receive signal from a conductive probe; a motion control system to control motion of the conductive probe; and at least one tangible, non-transitory computer-readable medium for storing instructions that when executed cause a hardware processor to execute operations, the operations including activating a charged particle beam within a first reference frame, the first reference frame associated with the charge particle beam; causing the charged particle beam and a conductive probe to intersect; measuring, by the signal measurement circuitry, an electrical response from the intersection of the charged particle beam and the probe; determining a location of the probe in a second reference frame based on the electric response from the intersection of the charged particle beam and the probe, the second reference frame associated with the conductive probe; and determining a location of the probe in the first reference frame based on the location of the probe in the second reference frame.

Example 30 may include the subject matter of example 29, wherein measuring the electrical response includes measuring a net current absorbed by the probe from the intersection of the charged particle beam and the probe.

Example 31 may include the subject matter of any of examples 29-30, and the operations also include performing a first series of probe scans through a charged particle beam region; for each of the first series of probe scans, measuring a first set of electrical responses corresponding to an intersection of the probe with the charged particle beam; creating a current profile of the probe based on the first set of electrical response from each of the first series of scans; and wherein determining the location of the probe includes performing a second series of probe scans through the charged particle beam region, the second series of probe scans including a fewer number of scans than the first series of probe scans; for each of the second series of probe scans, measuring a second set of electrical responses corresponding to an intersection of the probe with the charged particle beam; determining a location of the probe based on a comparison of the first set of electrical responses with the second set of electrical responses.

Example 32 may include the subject matter of any of examples 29-31, wherein causing the charged particle beam and a conductive probe to intersect includes causing the charged particle beam to intersect the conductive probe at a first position of the conductive probe; the operations including measuring a first electrical response from the intersection of the charged particle beam and the conductive probe at the first position; determining that the charged particle beam and the conductive probe intersect at the first position of the conductive probe based on the measured first electrical response; causing the charged particle beam and a conductive probe to intersect at a second position of the conductive probe; measuring a second electrical response from the intersection of the charged particle beam and the conductive probe at the second position; and determining that the charged particle beam and the conductive probe intersect at the second position of the conductive probe based on the measured second electrical response.

Example 33 may include the subject matter of any of examples 29-32, wherein determining a location of the probe in a second reference frame based on the electric response from the intersection of the charged particle beam with the probe includes determining an X and Y position of the conductive probe within the second reference frame.

Example 34 may include the subject matter of example 33, and the operations include correlating the X and Y position of the conductive probe within the second reference frame with a coordinate system of the first reference frame.

Example 35 may include the subject matter of example 34, and the operations include correlating the X and Y position of the conductive probe within the second reference frame with a coordinate system of the first reference frame using a transformation matrix.

What is claimed is:

1. A method performed in a charged particle imaging system, the method comprising:
    activating a charged particle beam within a first reference frame, the first reference frame associated with the charge particle beam;
    correlating a sample stage reference frame with a sample reference frame;
    causing, by a computerized control system, the charged particle beam and a conductive probe to intersect;
    measuring an electrical response from a location where the charged particle beam and the conductive probe intersect;
    determining a location of the conductive probe in a second reference frame based on the electric response from the intersection of the charged particle beam with the conductive probe, the second reference frame associated with the conductive probe; and
    correlating the location of the conductive probe in the second reference frame with the first reference frame.

2. The method of claim 1, wherein measuring the electrical response comprises measuring a net current absorbed by the conductive probe from the intersection of the charged particle beam and the conductive probe.

3. The method of claim 1, comprising:
    performing a first series of probe scans through a charged particle beam region;
    for each of the first series of probe scans, measuring a first set of electrical responses corresponding to an intersection of the conductive probe with the charged particle beam;

creating a current profile of the conductive probe based on the first set of electrical response from each of the first series of probe scans; and wherein determining the location of the conductive probe comprises:

performing a second series of probe scans through the charged particle beam region, the second series of probe scans comprising a fewer number of scans than the first series of probe scans;

for each of the second series of probe scans, measuring a second set of electrical responses corresponding to an intersection of the conductive probe with the charged particle beam; and determining a location of the conductive probe based on a comparison of the first set of electrical responses with the second set of electrical responses.

4. The method of claim 1, wherein causing the charged particle beam and the conductive probe to intersect comprises causing the charged particle beam and the conductive probe to intersect at a first position of the conductive probe; the method comprising:

measuring a first electrical response from the intersection of the charged particle beam and the conductive probe at the first position;

determining that the charged particle beam and the conductive probe intersect at the first position of the conductive probe based on the measured first electrical response;

causing the charged particle beam and the conductive probe to intersect at a second position of the conductive probe;

measuring a second electrical response from the intersection of the charged particle beam and the conductive probe at the second position; and determining that the charged particle beam and the conductive probe intersect at the second position of the conductive probe based on the measured second electrical response.

5. The method of claim 1, wherein determining a location of the conductive probe in a second reference frame based on the electric response from the intersection of the charged particle beam with the conductive probe comprises determining an X and Y position of the conductive probe within the second reference frame.

6. The method of claim 5, comprising correlating the X and Y position of the conductive probe within the second reference frame with a coordinate system of the first reference frame.

7. The method of claim 6, comprising correlating the X and Y position of the conductive probe within the second reference frame with a coordinate system of the first reference frame using a transformation matrix.

8. The method of claim 1, wherein activating the charged particle beam within a first reference frame comprises activating the charged particle beam at a fixed, known location within the first reference frame.

9. The method of claim 8, wherein causing the charged particle beam and the conductive probe to intersect comprises moving the conductive probe to intersect charged particle beam at a first position of the conductive probe.

10. The method of claim 1, wherein causing the charged particle beam and the conductive probe to intersect comprises moving the charged particle beam to intersect the conductive probe.

11. The method of claim 10, wherein moving the charged particle beam to intersect the conductive probe comprises:

determining a scan angle for the charged particle beam to intersect the conductive probe; and moving the charged particle beam to intersect the conductive probe based on the determined scan angle.

12. The method of claim 10, wherein moving the charged particle beam to intersect the conductive probe comprises:

moving the charged particle beam in a circular direction at a first radius of curvature to intersect the conductive probe at a first position of the conductive probe;

determining that the charged particle beam intersects the first position of the conductive probe;

moving the charged particle beam in a circular direction at a second radius of curvature to intersect the conductive probe at a second position of the conductive probe; and determining that the charged particle beam intersects the second position of the conductive probe.

13. The method of claim 12, wherein the second radius of curvature is less than the first radius of curvature.

14. The method of claim 12, wherein the conductive probe is a first conductive probe, the method further comprising:

determining that the charged particle beam intersects a second conductive probe at a third position of the second conductive probe; and moving the charged particle beam in a circular direction at a third radius of curvature to intersect the second conductive probe at a fourth position of the second conductive probe.

15. A system comprising:

an imaging system comprising a charged particle beam emitter to emit a charged particle beam;

a nanoprober comprising an actuator, the nanoprober configured to secure a conductive probe;

signal measurement circuitry electrically coupled to the conductive probe, the signal measurement circuit to receive signal from the conductive probe; and at least one tangible, non-transitory computer-readable medium for storing instructions that when executed cause a hardware processor to execute operations, the operations comprising:

activating a charged particle beam within a first reference frame, the first reference frame associated with the charge particle beam;

correlating a sample stage reference frame with a sample reference frame;

causing, by a computerized control system, the charged particle beam and the conductive probe to intersect;

measuring an electrical response from the intersection of the charged particle beam with the conductive probe;

determining a location of the conductive probe in a second reference frame based on the electric response from the intersection of the charged particle beam and the conductive probe, the second reference frame associated with the conductive probe; and correlating the location of the conductive probe in the second reference frame with the first reference frame, the sample stage reference frame, and the sample reference frame.

16. The system of claim 15, wherein measuring the electrical response comprises measuring a net current absorbed by the conductive probe from the intersection of the charged particle beam and the conductive probe.

17. The system of claim 15, the operations comprising:
performing a first series of probe scans through a charged particle beam region;

for each of the first series of probe scans, measuring a first set of electrical responses corresponding to an intersection of the conductive probe with the charged particle beam;

creating a current profile of the conductive probe based on the first set of electrical response from each of the first series of probe scans; and wherein determining the location of the conductive probe comprises:

performing a second series of probe scans through the charged particle beam region, the second series of probe scans comprising a fewer number of scans than the first series of probe scans;

for each of the second series of probe scans, measuring a second set of electrical responses corresponding to an intersection of the conductive probe with the charged particle beam; and determining a location of the conductive probe based on a comparison of the first set of electrical responses with the second set of electrical responses.

18. The system of claim 15, wherein causing the charged particle beam and a conductive probe to intersect comprises causing the charged particle beam and the conductive probe to intersect at a first position of the conductive probe; the operations comprising:

measuring a first electrical response from the intersection of the charged particle beam and the conductive probe at the first position;

determining that the charged particle beam and the conductive probe intersect at the first position of the conductive probe based on the measured first electrical response;

causing the charged particle beam and the conductive probe to intersect at a second position of the conductive probe;

measuring a second electrical response from the intersection of the charged particle beam and the conductive probe at the second position; and determining that the charged particle beam and the conductive probe intersect at the second position of the conductive probe based on the measured second electrical response.

19. The system of claim 15, wherein determining a location of the conductive probe in a second reference frame based on the electric response from the intersection of the charged particle beam with the conductive probe comprises determining an X and Y position of the conductive probe within the second reference frame.

20. The system of claim 19, the operations comprising correlating the X and Y position of the conductive probe within the second reference frame with a coordinate system of the first reference frame.

21. The system of claim 20, the operations comprising correlating the X and Y position of the conductive probe within the second reference frame with a coordinate system of the first reference frame using a transformation matrix.

22. The system of claim 15, wherein activating the charged particle beam within a first reference frame comprises activating the charged particle beam at a fixed, known location within the first reference frame.

23. The system of claim 22, the operations further comprising a motion control system to control motion of the nanoprober actuator based on information received from the signal measurement circuitry, the motion of the nanoprober actuator to move the conductive probe, and wherein causing the charged particle beam and the conductive probe to intersect comprises moving, by the motion control system, the conductive probe to intersect charged particle beam at a first position of the conductive probe.

24. The system of claim 15, wherein causing the charged particle beam to intersect the conductive probe comprises moving the charged particle beam to intersect the conductive probe.

25. The system of claim 24, wherein moving, by the motion control system, the charged particle beam to intersect the conductive probe comprises:

determining a scan angle for the charged particle beam to intersect the conductive probe; and moving the charged particle beam to intersect the conductive probe based on the determined scan angle.

26. The system of claim 24, wherein moving the charged particle beam to intersect the conductive probe comprises:

moving the charged particle beam in a circular direction at a first radius of curvature to intersect the conductive probe at a first position of the conductive probe;

determining that the charged particle beam intersects the first position of the conductive probe;

moving the charged particle beam in a circular direction at a second radius of curvature to intersect the conductive probe at a second position of the conductive probe; and determining that the charged particle beam intersects the second position of the conductive probe.

27. The system of claim 26, wherein the second radius of curvature is less than the first radius of curvature.

28. The system of claim 26, wherein the conductive probe is a first conductive probe, the operations further comprising:

determining that the charged particle beam intersects a second conductive probe at a third position of the second conductive probe; and moving the charged particle beam in a circular direction at a third radius of curvature to intersect the second conductive probe at a fourth position of the second conductive probe.

* * * * *